US011289518B2

(12) United States Patent
Kao et al.

(10) Patent No.: US 11,289,518 B2
(45) Date of Patent: Mar. 29, 2022

(54) ARRAY SUBSTRATE AND METHOD FOR MAKING SAME

(71) Applicant: HON HAI PRECISION INDUSTRY CO., LTD., New Taipei (TW)

(72) Inventors: Yi-Chun Kao, New Taipei (TW); Hsin-Hua Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 5 days.

(21) Appl. No.: 16/393,314

(22) Filed: Apr. 24, 2019

(65) Prior Publication Data

US 2019/0252418 A1 Aug. 15, 2019

Related U.S. Application Data

(62) Division of application No. 15/252,900, filed on Aug. 31, 2016, now Pat. No. 10,319,752.

(60) Provisional application No. 62/220,257, filed on Sep. 18, 2015, provisional application No. 62/220,261, filed on Sep. 18, 2015, provisional application No. 62/220,258, filed on Sep. 18, 2015, provisional application No. 62/220,259, filed on Sep. 18, 2015.

(51) Int. Cl.
| | |
|---|---|
| *H01L 27/12* | (2006.01) |
| *H01L 29/786* | (2006.01) |
| *H01L 29/66* | (2006.01) |
| *H01L 21/265* | (2006.01) |
| *H01L 29/417* | (2006.01) |
| *H01L 29/49* | (2006.01) |
| *H01L 27/32* | (2006.01) |

(52) U.S. Cl.
CPC .... *H01L 27/1251* (2013.01); *H01L 21/26513* (2013.01); *H01L 27/127* (2013.01); *H01L 27/1225* (2013.01); *H01L 27/1233* (2013.01); *H01L 27/1237* (2013.01); *H01L 27/1255* (2013.01); *H01L 27/1259* (2013.01); *H01L 27/1288* (2013.01); *H01L 29/41733* (2013.01); *H01L 29/66757* (2013.01); *H01L 29/66969* (2013.01); *H01L 29/78675* (2013.01); *H01L 27/3262* (2013.01); *H01L 29/4908* (2013.01); *H01L 29/7869* (2013.01); *H01L 29/78621* (2013.01); *H01L 29/78678* (2013.01); *H01L 29/78696* (2013.01)

(58) Field of Classification Search
CPC .................................................. H01L 27/1251
See application file for complete search history.

(56) References Cited

U.S. PATENT DOCUMENTS 9,721,973 B2 * 8/2017 Lee ...................... H01L 27/1229
9,818,765 B2 * 11/2017 Osawa ................ H01L 27/1225
(Continued)

*Primary Examiner* — Abul Kalam
(74) *Attorney, Agent, or Firm* — ScienBiziP, P.C.

(57) ABSTRACT

An array substrate includes a substrate, a first insulator layer on the substrate, a second insulator layer on the first insulator layer, a third insulator layer on the second insulator layer, and a first TFT and a second TFT on the substrate. The second TFT includes a second gate electrode on the first insulator layer, a second channel layer on the second insulator layer, and a second source electrode and a second drain electrode on the third insulator layer. The third insulator layer covers the second channel layer and defines a second source hole and a second drain hole.

7 Claims, 15 Drawing Sheets

(56) References Cited

U.S. PATENT DOCUMENTS

| | | | | |
|---|---|---|---|---|
| 2007/0159074 | A1* | 7/2007 | Choi | H01L 27/124 |
| | | | | 313/504 |
| 2010/0019996 | A1* | 1/2010 | You | H01L 27/1225 |
| | | | | 345/76 |
| 2010/0182223 | A1* | 7/2010 | Choi | G09G 3/3233 |
| | | | | 345/76 |
| 2013/0168666 | A1* | 7/2013 | Yan | H01L 27/1225 |
| | | | | 257/43 |
| 2015/0055047 | A1* | 2/2015 | Chang | H01L 27/1225 |
| | | | | 349/43 |
| 2015/0055051 | A1* | 2/2015 | Osawa | H01L 27/1251 |
| | | | | 349/48 |

* cited by examiner

ARRAY SUBSTRATE AND METHOD FOR MAKING SAME

CROSS-REFERENCE TO RELATED APPLICATIONS

This application is a divisional/continuation application of U.S. Ser. No. 15/252,900, filed Aug. 31, 2016 the contents of which are hereby incorporated by reference. The patent application Ser. No. 15/252,900 in turn claims priority from U.S. provisional applications Ser. Nos. 62/220,257, 62/220,258, 62/220,259, and 62/220,261 filed on Sep. 18, 2015.

FIELD

The subject matter herein generally relates to an array substrate and a method for making the array substrate.

BACKGROUND

Two common kinds of display devices are liquid crystal display (LCD) and organic light-emitting diode display (OLED). The display device usually includes an array substrate containing a plurality of thin film transistors formed thereon.

BRIEF DESCRIPTION OF THE DRAWINGS

Implementations of the present technology will now be described, by way of example only, with reference to the attached figures.

DETAILED DESCRIPTION

Figure 1:
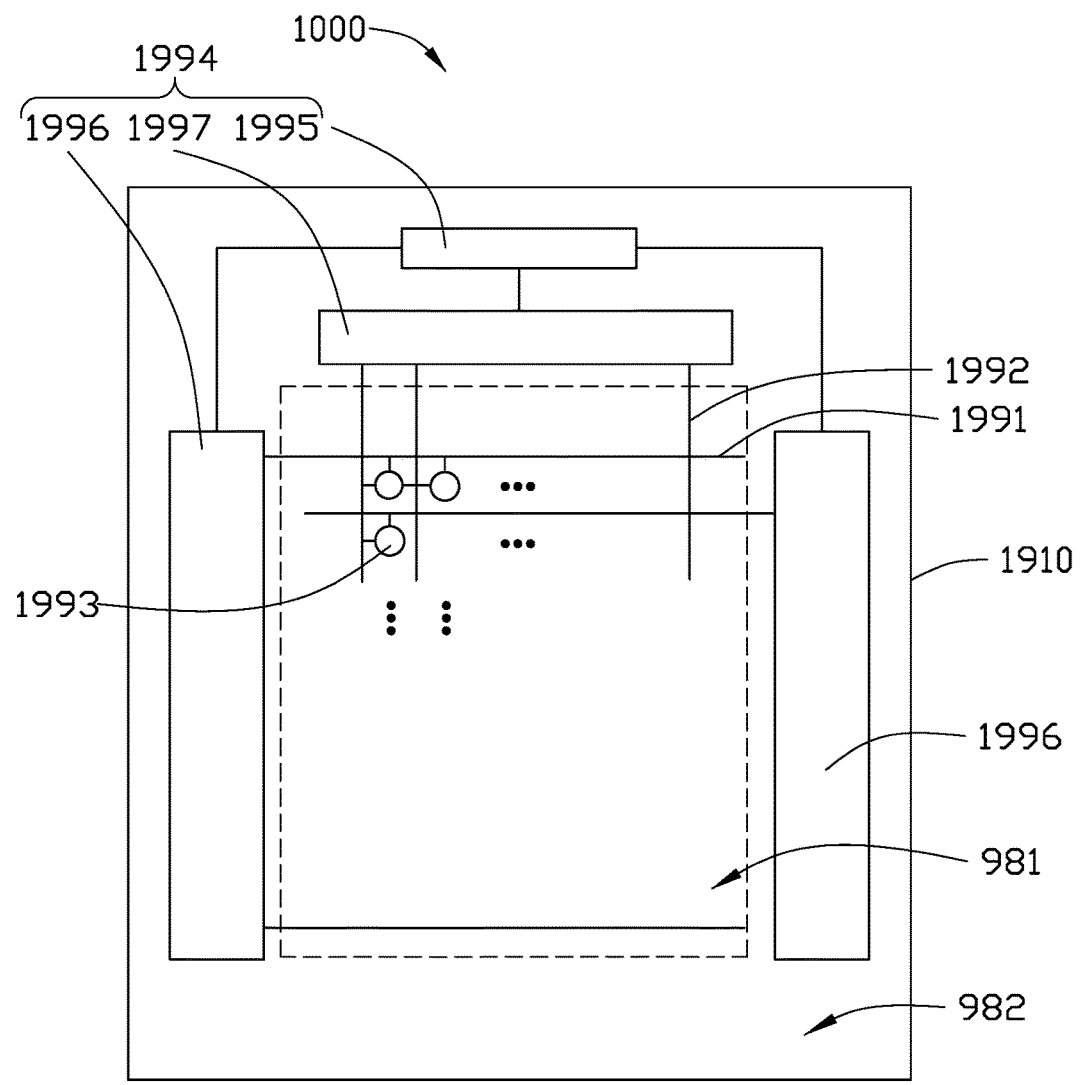
FIG. 1 is a planar view of a first exemplary embodiment of an array substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates a first exemplary embodiment of an array substrate (array substrate 1000). The array substrate 1000 includes a substrate 1910, a plurality of scan lines 1991 on the substrate 1910, a plurality of data lines 1992 on the substrate 1910, a plurality of pixels 1993, and a driving circuit 1994 configured to provide electrical signals to the scan lines 1991 and the data lines 1992. The scan lines 1991 intersect with the data lines 1992, and each pixel 1993 is defined in an intersection area defined by two scan lines 1991 and two data lines 1992. The array substrate 1000 defines a display area 981 and a peripheral area 982 around the display area 981. The scan lines 1991, the data lines 1992, and the pixels 1993 may be positioned in the display area 981. The driving circuit 1994 may be positioned in the peripheral area 982.

In this exemplary embodiment, the driving circuit 1994 includes an overall driving circuit 1995, at least one scan driving circuit 1996 configured to provide electrical signals to the scan lines 1991, and at least one data driving circuit 1997 configured to provide electrical signals to the data lines 1992. The overall driving circuit 1995 is configured to provide electrical signals to the scan driving circuit 1996 and the data driving circuit 1997. The scan driving circuit 1996 and the driving circuit 1997 can be positioned adjacent to a top side, a bottom side, a left side, or a right side of the array substrate 1000. In this exemplary embodiment, the array substrate 1000 includes two scan driving circuits 1996 and one data driving circuit 1997. One scan driving circuit 1996 is positioned adjacent to the left side of the array substrate 1000 and the other scan driving circuit 1996 is positioned adjacent to the right side of the array substrate 1000. The data driving circuit 1997 is positioned adjacent to the top side of the array substrate 1000. The overall driving circuit 1995 is positioned at a side of the data driving circuit 1997 away from the display area 981. In other exemplary embodiment, the overall driving circuit 1995 can be positioned outside of the array substrate 1000.

Both the scan driving circuit 1996 and the data driving circuit 1997 may include a plurality of thin film transistors (TFTs) on the substrate 1910. The pixels 1993 may include a plurality of TFTs. In this exemplary embodiment, at least one TFT of the scan driving circuit 1996 and at least one TFT of the data driving circuit 1997 each has a channel layer that is made of a semiconducting material containing polycrystalline silicon (hereinafter "polycrystalline silicon TFT"), so as to achieve a high electron mobility and a small volume. At least one of the TFTs in the pixels 1993 has a channel layer that is made of a semiconducting material containing metal oxide (hereinafter "metal oxide TFT"), so as to achieve a low leakage current.

TFTs of the scan driving circuit 1996 and the data driving circuit 1997 are not limited to polycrystalline silicon TFTs only. That is, both the scan driving circuit 1996 and the data driving circuit 1997 can include the polycrystalline silicon TFTs and the metal oxide TFTs. The TFTs in the pixels 1993 are not limited to only metal oxide TFTs. That is, the TFTs in the pixels 1993 can include the polycrystalline silicon TFTs and the metal oxide TFTs.

Figure 2:
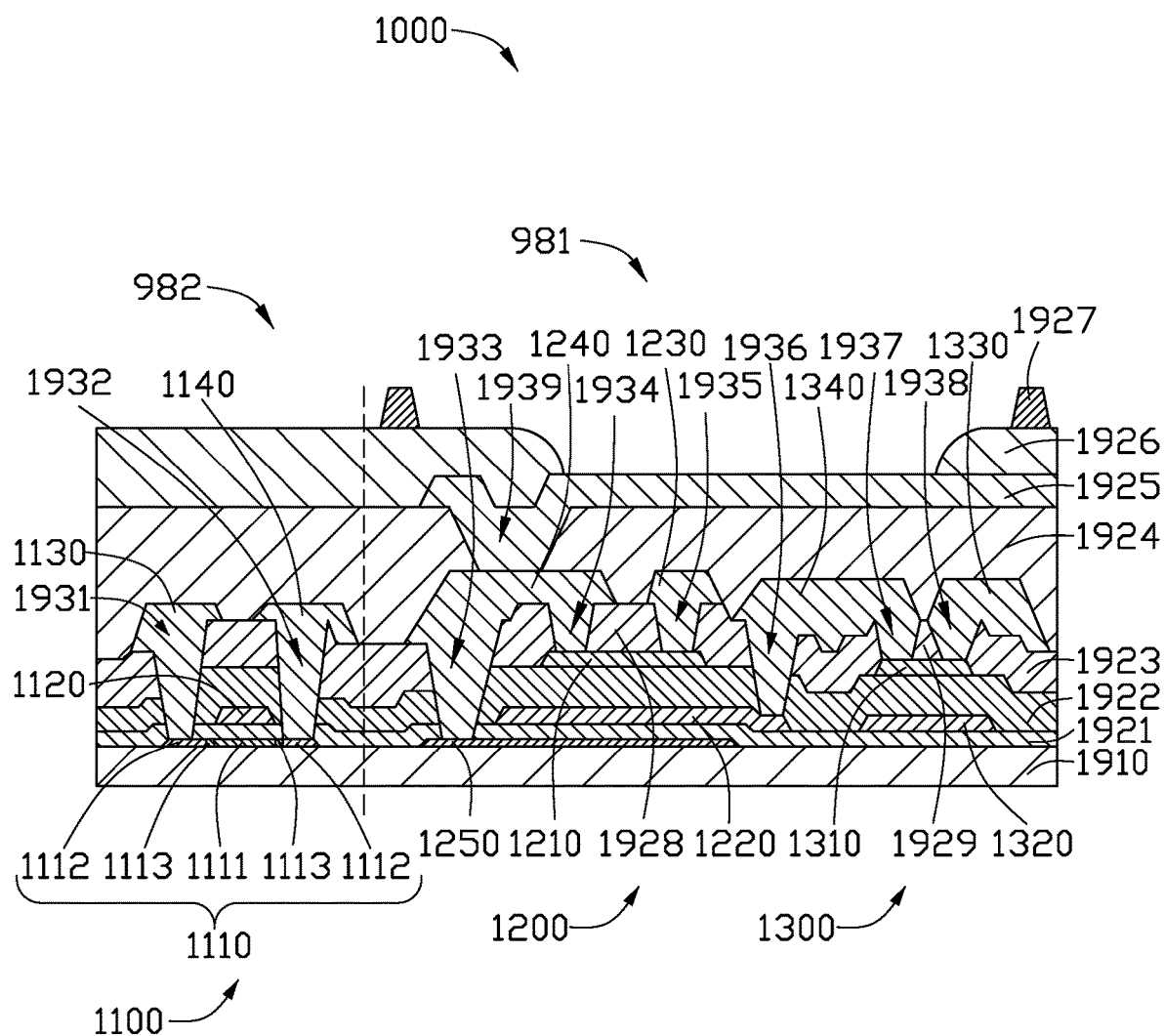
FIG. 2 is a cross-sectional view of the array substrate of FIG. 1.

FIG. 2 illustrates the first exemplary embodiment of the array substrate 1000 in part and in cross-section. The array substrate 1000 may be used for an OLED device. The array substrate 1000 further includes a plurality of first TFTs 1100, a plurality of second TFTs 1200, and a plurality of third TFTs 1300. That is, the array substrate 1000 includes at least three types of TFTs, these being the first TFT 1100, the second TFT 1200, and the third TFT 1300. FIG. 2 only shows one first TFT 1100, one second TFT 1200, and one third TFT 1300. In this exemplary embodiment, the first TFTs 1100 are positioned in the peripheral area 982 and applied in the scan driving circuit 1996 and the data driving circuit 1997. The second TFTs 1200 and the third TFTs 1300 are positioned in the display area 981. The second TFTs 1200 are used as driving TFTs of the pixels 1993, and the third TFTs 1300 are used as switching TFTs of the pixels 1993.

The array substrate 1000 further includes a first insulator layer 1921, a second insulator layer 1922, a third insulator layer 1923, a fourth insulator layer 1924, an anode layer 1925, a pixel electrode layer 1926, and a spacer layer 1927. These layers are laminated over the substrate 1910.

The first TFT 1100 includes a first channel layer 1110, a first gate electrode 1120, a first source electrode 1130, and a first drain electrode 1140. The second TFT 1200 includes a second channel layer 1210, a second gate electrode 1220, a second source electrode 1230, and a second drain electrode 1240. The third TFT 1300 includes a third channel layer 1310, a third gate electrode 1320, a third electrode source 1330, and a third drain electrode 1340. A storage capacitance layer 1250 is formed under the second TFT 1200.

A channel layer defines the semiconductive/active region of a TFT device (e.g., of the first TFT 1100, the second TFT 1200, and the third TFT 1300) through which charge carriers may move. The channel layer may comprise a suitable semiconducting material, which may include an oxide semiconductor, elemental semiconductor, compound semiconductor, and alloy semiconducting material. The semiconductive material may be selectively disposed in one of an amorphous, crystalline, and poly-crystalline state, or a combination of these structures. In some exemplary embodiments, the channel layer comprises one or more oxide type compound semiconducting materials, such as indium-gallium-zinc oxide (IGZO), indium-zinc-tin oxide (IZTO), indium-gallium-tin oxide (IGTO), and indium-aluminum-zinc oxide (IAZO) material. In some exemplary embodiments, the channel layer comprises substantially hydrogenated amorphous silicon (a-Si: H). The amorphous silicon channel material, which offers high charge carrier mobility (e.g., about 0.1-1 cm2v-1s-1) and high thin film uniformity, may be implemented for economic considerations. In some exemplary embodiments, the channel layer comprises polycrystalline silicon material prepared in a low temperature process (e.g., low temperature polycrystalline silicone (LTPS)). The LTPS channel material offers superior charge carrier mobility (e.g., about 100-200 cm2v-1s-1), but requires greater fabrication cost, particularly in the application of large size display panel devices.

The first channel layer 1110 and the storage capacitance layer 1250 may be directly formed on the substrate 1910. Both the first channel layer 1110 and the storage capacitance layer 1250 are made of a semiconducting material containing polycrystalline silicon. The first channel layer 1110 may be doped with P-type ions or N-type ions. In the exemplary embodiment, the P-type ion has a valence charge of positive three, such as boron ion; and the N-type ion has a valence charge of positive five, such as phosphate ion. In this exemplary embodiment, the first channel layer 1110 is doped with P-type ions and includes a non-doped portion 1111, two lightly-doped portions 1113, and two heavily-doped portions 1112. The non-doped portion 1111 is located in the center of the first channel layer 1110, and the two lightly-doped portions 1113 are located on opposite sides of the non-doped portion 1111. Each heavily-doped portion 1112 is located on one side of one lightly-doped portion 1113 away from the non-doped portion 1111.

Both the lightly-doped portions 1113 and the heavily-doped portions 1112 are made of polycrystalline silicon doped with P-type ions. The heavily-doped portion 1112 has a P-type ion concentration that is greater than that of the lightly-doped portion 1113, and the lightly-doped portion 1113 has a P-type ion concentration that is greater than that of the non-doped portion 1111.

The storage capacitance layer 1250 is made of same materials as the heavily-doped portion 1112. That is, the storage capacitance layer 1250 is made of heavily-doped polycrystalline silicon. The storage capacitance layer 1250 is configured to be an electrode for the storage capacitor.

The first insulator layer 1921 is formed on the substrate 1910 and covers the first channel layer 1110 and the storage capacitance layer 1250. The first gate electrode 1120, the second gate electrode 1220, and the third gate electrode 1320 are formed on the first insulator layer 1921. The first gate electrode 1120 corresponds to the first channel layer 1110, and particularly corresponds to the non-doped portion 1111. The second gate electrode 1220 corresponds to the storage capacitance layer 1250.

The second insulator layer 1922 is formed on the first insulator layer 1921 and covers the first gate electrode 1120, the second gate electrode 1220, and the third gate electrode 1320. The second channel layer 1210 and the third channel layer 1310 are formed on the second insulator layer 1922. The second channel layer 1210 corresponds to the second gate electrode 1220. The third channel layer 1310 corresponds to the third gate electrode 1320. Both the second channel layer 1210 and the third channel layer 1310 are made of a semiconducting material which contains metal oxide. In this exemplary embodiment, both the second channel layer 1210 and the third channel layer 1310 are made of IGZO.

As the first gate electrode 1120 is vertically above the first channel layer 1110, the first TFT 1100 is referred to as the "top gate" arrangement. As the second gate electrode 1220 is vertically under the second channel layer 1210, the second TFT 1200 is referred to as the "bottom gate" arrangement. The third TFT 1300 is also referred to as the "bottom gate" arrangement.

The third insulator layer 1923 is formed on the second insulator layer 1922 and covers the second channel layer 1210 and the third channel layer 1310. A first source hole 1931 corresponding to one of the heavily-doped portions 1112 is defined in the third insulator layer 1923 and passes through the third insulator layer 1923, the second insulator layer 1922, and the first insulator layer 1921. A first drain hole 1932 corresponding to another heavily-doped portion 1112 is defined in the third insulator layer 1923 and passes through the third insulator layer 1923, the second insulator layer 1922, and the first insulator layer 1921. A storage capacitance hole 1933 corresponding to the storage capacitance layer 1250 is defined in the third insulator layer 1923 and passes through the third insulator layer 1923, the second insulator layer 1922, and the first insulator layer 1921. A second drain hole 1934 corresponding to the second channel layer 1210 is defined in the third insulator layer 1923 and passes through the third insulator layer 1923. A second source hole 1935 corresponding to the second channel layer 1210 is defined in the third insulator layer 1923 and passes through the third insulator layer 1923. The second drain hole 1934 is positioned adjacent to a left side of the second channel layer 1210, and the second source hole 1935 is positioned adjacent to a right side of the second channel layer 1210. A second gate hole 1936 corresponding to the second gate electrode 1220 is defined in the third insulator layer 1923 and passes through the third insulator layer 1923 and the second insulator layer 1922. A third drain hole 1937 corresponding to the third channel layer 1310 is defined in the third insulator layer 1923 and passes through the third insulator layer 1923. A third source hole 1938 corresponding to the third channel layer 1310 is defined in the third insulator layer 1923 and passes through the third insulator layer 1923. The third drain hole 1937 is positioned adjacent to a left side of the third channel layer 1310, and the third source hole 1938 is positioned adjacent to a right side of the third channel layer 1310.

A portion of the third insulator layer 1923 that is positioned between the second drain hole 1934 and the second source hole 1935 is defined as a protection portion 1928. The protection portion 1928 covers at least a portion of the second channel layer 1210 and protects the second channel layer 1210 from damage during an etching process to form the second source electrode 1230 and the second drain electrode 1240. A portion of the third insulator layer 1923 positioned between the third drain hole 1937 and the third source hole 1938 is defined as another protection portion 1929. The protection portion 1929 covers at least a portion of the third channel layer 1310 and protects the third channel layer 1310 from damage during the etching process to form the third source electrode 1330 and the third drain electrode 1340.

The first source electrode 1130 is formed on the third insulator layer 1923 and extends into the first source hole 1931, to electrically couple to one of the heavily-doped portions 1112. The first drain electrode 1140 is formed on the third insulator layer 1923 and extends into the first drain hole 1932 to electrically couple to another heavily-doped portion 1112. The second source electrode 1230 is formed on the third insulator layer 1923 and extends into the second source hole 1935 to electrically couple to the second channel layer 1210. The second drain electrode 1240 is formed on the third insulator layer 1923 and extends into the second drain hole 1934 to electrically couple to the second channel layer 1210. The second drain electrode 1240 also extends into the storage capacitance hole 1933 to electrically couple to the storage capacitance layer 1250. The storage capacitance layer 1250 and the second gate electrode 1220 thereby cooperatively form a storage capacitor. The third source electrode 1330 is formed on the third insulator layer 1923 and extends into the third source hole 1938 to electrically couple to the third channel layer 1310. The third drain electrode 1340 is formed on the third insulator layer 1923 and extends into the third drain hole 1937 to electrically couple to the third channel layer 1310. The third drain electrode 1340 also extends into the second gate hole 1936 to electrically couple to the second gate electrode 1220.

The fourth insulator layer 1924 is formed on the third insulator layer 1923 and covers the first source electrode 1130, the first drain electrode 1140, the second source electrode 1230, the second drain electrode 1240, the third source electrode 1330, and the third drain electrode 1340. An anode hole 1939 corresponding to the second drain electrode 1240 is defined in the fourth insulator layer 1924 and passes through the fourth insulator layer 1924. The anode layer 1925 is formed on the fourth insulator layer 1924 and extends into the anode hole 1939 to electrically couple to the second drain electrode 1240. The pixel electrode layer 1926 is formed on the fourth insulator layer 1924 and partially covers the anode layer 1925. The spacer layer 1927 is formed on the pixel electrode layer 1926.

In some exemplary embodiments, the array substrate 1000 may further include a buffer layer (not shown) formed on the substrate 1910. In this situation, the first channel layer 1110, the storage capacitance layer 1250, and the first insulator layer 1921 are formed on the buffer layer.

The substrate 1910 typically comprises an insulating material. Suitable materials for the substrate 1910 may include glass, quartz, and plastic, provided only that such material has sufficient optical transparency (e.g., for electromagnetic radiations in the visible spectrum for visual display applications). In some exemplary embodiments, the substrate 1910 may comprise ceramic and/or silicon materials. In some applications, flexible substrate materials may be adopted. Suitable materials for the flexible substrate may include, for example, polyethersulfone (PES), polyethylenenaphthalate (PEN), polyethylene (PE), polyimide (PI), polyvinyl chloride (PVC), polyethylene terephthalate (PET), and stainless steel, or combinations thereof.

The first gate electrode 1120, the first source electrode 1130, the first drain electrode 1140, the second gate electrode 1220, the second source electrode 1230, the second drain electrode 1240, the third gate electrode 1320, the third source electrode 1330, the third drain electrode 1340 may comprise aluminum (Al), silver (Ag), gold (Au), cobalt (Co), chromium (Cr), copper (Cu), indium (In), manganese (Mn), molybdenum (Mo), nickel (Ni), neodymium (Nd), palladium (Pd), platinum (Pt), titanium (Ti), tungsten (W), zinc (Zn), other suitable conductive materials, and a suitable mixture/alloy thereof. For achieving greater optical efficiency, in some exemplary embodiments, the first gate electrode 1120, the first source electrode 1130, the first drain electrode 1140, the second gate electrode 1220, the second source electrode 1230, the second drain electrode 1240, the third gate electrode 1320, the third source electrode 1330, and the third drain electrode 1340 may include a transparent conductive material, such as indium tin oxide (ITO), indium zinc oxide (IZO), aluminum doped zinc oxide (AZO), or a suitable combination thereof.

The first insulator layer 1921, the second insulator layer 1922, the third insulator layer 1923, and the fourth insulator layer 1924 may comprise a suitable dielectric material, such as silicon oxide (SiOx), silicon nitride (SiNx), silicon oxynitride (SiOxNy), aluminum oxide (AlOx), yttrium oxide (Y2O3), hafnium oxide (HfOx), zirconium oxide (ZrOx), aluminum nitride (AlN), aluminum oxynitride (AlNO), titanium oxide (TiOx), barium titanate (BaTiO3), and lead titanate (PbTiO3). In some exemplary embodiments, one or more high-K dielectric materials may be used as the first insulator layer 1921, the second insulator layer 1922, the third insulator layer 1923, and the fourth insulator layer 1924. High-K dielectric materials may include, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof. The anode layer 1925 can be made of a transparent conductive material, such as ITO, IZO, AZO, or a suitable combination thereof.

The protection portion 1928 protects the second channel layer 1210 from damage during a forming process of the second source electrode 1230 and the second drain electrode 1240. The protection portion 1929 protects the third channel layer 1310 from damage during a forming process of the third source electrode 1330 and of the third drain electrode 1340. Thus, the array substrate 1000 has a good electrical property.

In this exemplary embodiment, the first TFTs 1100 are positioned in the peripheral area 982, and the second TFTs 1200 and the third TFTs 1300 are positioned in the display area 981. In other exemplary embodiments, the first TFTs 1100 are not limited to being positioned in the peripheral area 982 and can be positioned in the display area 981. The second TFTs 1200 and the third TFTs 1300 are not limited to being positioned in the display area 981 and can be positioned in the peripheral area 982.

Figure 3:
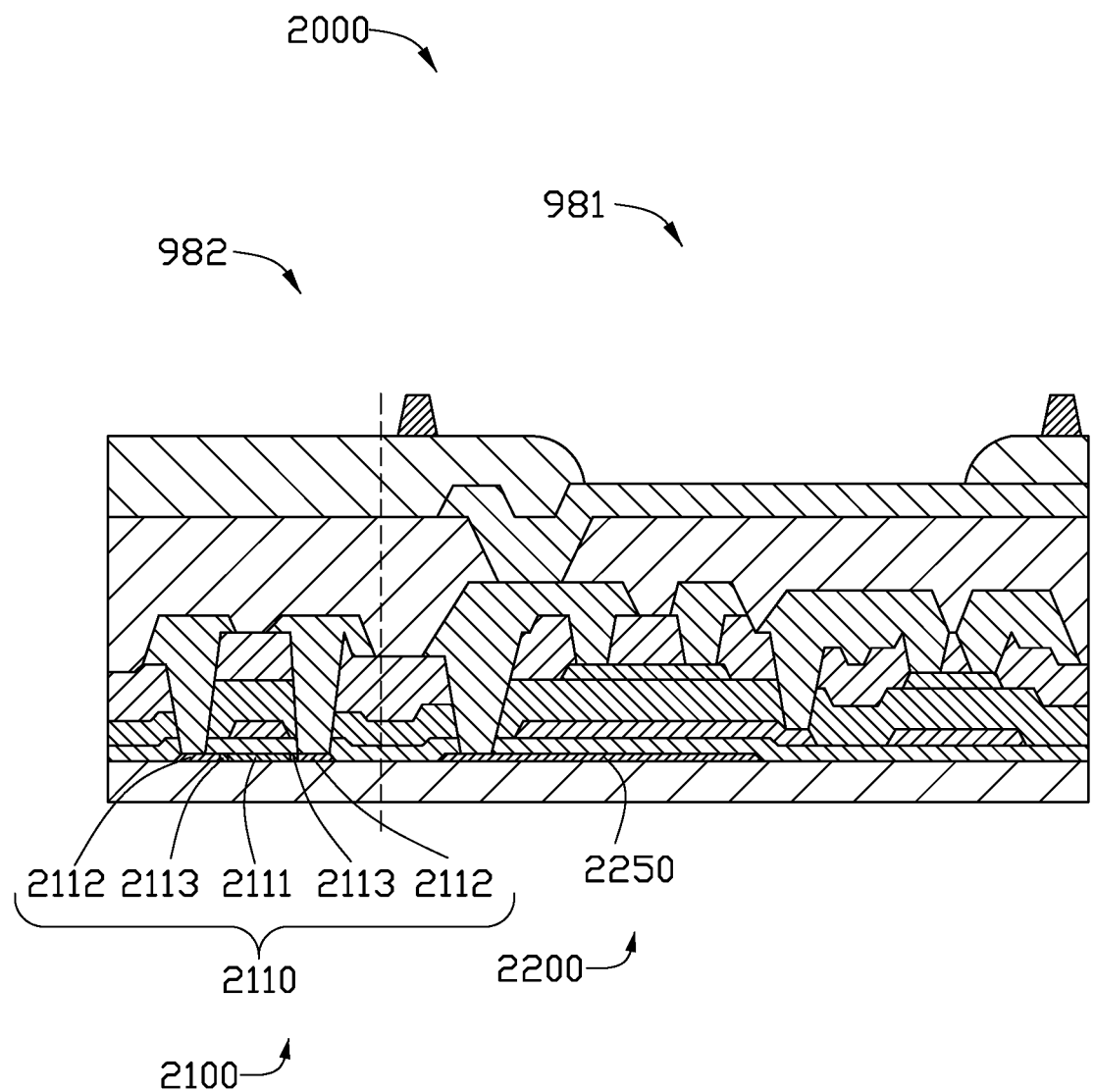
FIG. 3 is a cross-sectional view of a second exemplary embodiment of an array substrate.

FIG. 3 illustrates the second exemplary embodiment of the array substrate 2000 in part and in cross section. The array substrate 2000 is used in an OLED device. The array substrate 2000 is substantially the same as the array substrate 1000, except that the first TFT 2100 of the array substrate 2000 includes a first channel layer 2110 that is different from the first channel layer 1110. Also, the second TFT 2200 of the array substrate 2000 includes a storage capacitance layer 2250 that is different from the storage capacitance layer 1250.

The first channel layer 1110 in the first exemplary embodiment is made of polycrystalline silicon doped with P-type ions. The first channel layer 2110 in this, the second exemplary embodiment, is made of polycrystalline silicon doped with N-type ions. The storage capacitance layer 1250 in the first exemplary embodiment is also made of polycrystalline silicon doped with P-type ions, while the storage capacitance layer 2250 in this the second exemplary embodiment is made of polycrystalline silicon doped with N-type ions.

The first channel layer 2110 includes an ultra-lightly-doped portion 2111, two lightly-doped portions 2113, and two heavily-doped portions 2112. The ultra-lightly-doped portion 2111 is located in the center of the first channel layer 2110, the two lightly-doped portions 2113 are located on opposite sides of the ultra-lightly-doped portion 2111. Each heavily-doped portion 2112 is located at a side of one lightly-doped portion 2113 away from the ultra-lightly-doped portion 2111. The heavily-doped portion 2112 has a N-type ion concentration that is greater than that of the lightly-doped portion 2113, and the lightly-doped portion 2113 has a N-type ion concentration that is greater than that of the ultra-lightly-doped portion 2111.

The storage capacitance layer 2250 is made of same materials as the heavily-doped portion 2112. That is, the storage capacitance layer 2250 is made of heavily-doped polycrystalline silicon.

Figure 4:
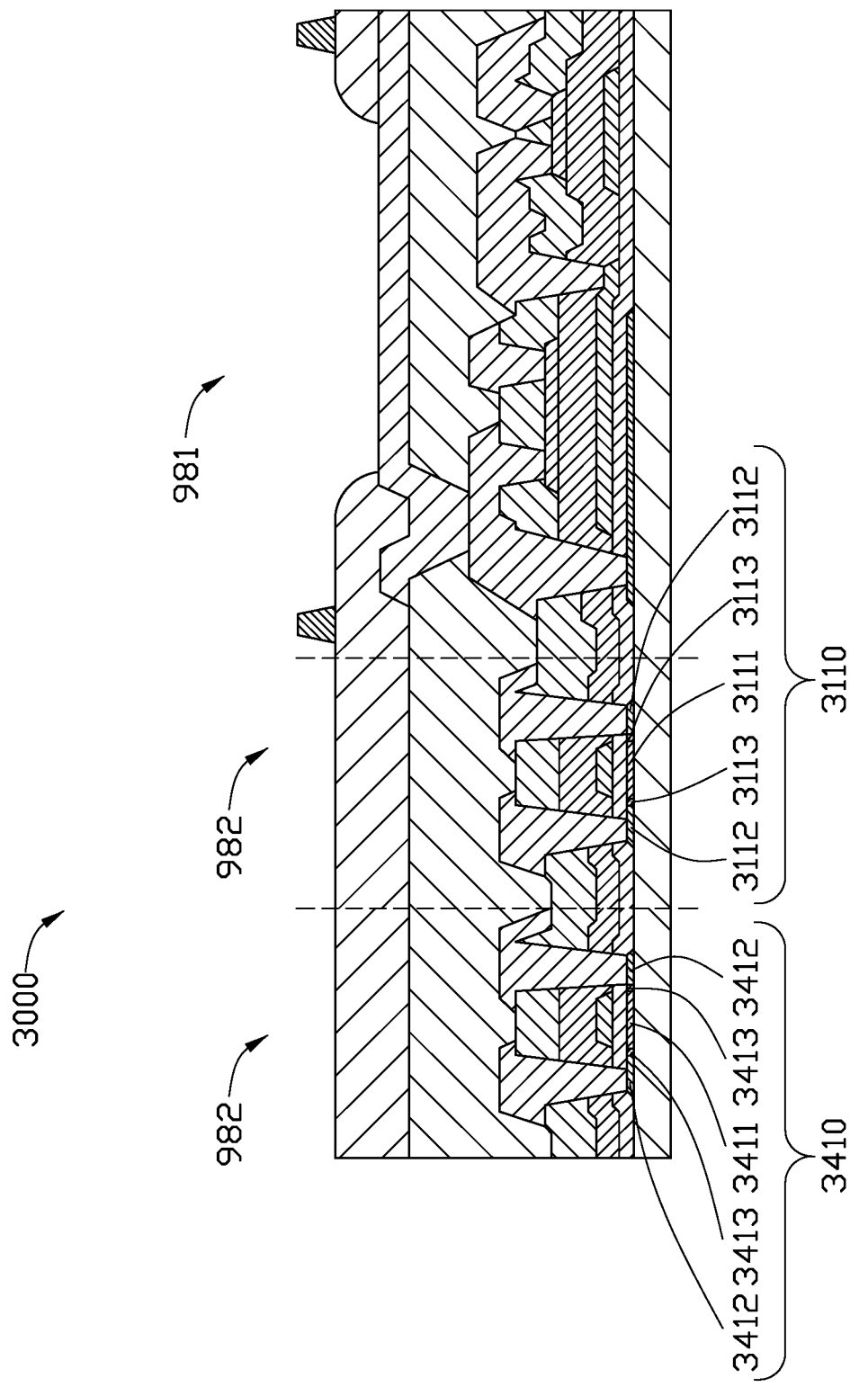
FIG. 4 is a cross-sectional view of a third exemplary embodiment of an array substrate.

FIG. 4 illustrates the third exemplary embodiment of the array substrate 3000 in part and in cross section. The array substrate 3000 is used in an OLED device. The array substrate 3000 is substantially the same as the array substrate 2000, except that the first TFT 3100 of the array substrate 3000 includes a first channel layer 3110 that is different from the first channel layer 2110. The array substrate 3000 further includes a fourth TFT 3400. The fourth TFT 3400 is positioned in the peripheral area 982 and at a side of the first TFT 3100.

In this exemplary embodiment, the first channel layer 3110 may be doped with N-type ions. First channel layer 3110 includes a non-doped portion 3111, two lightly-doped portions 3113, and two heavily-doped portions 3112. The non-N doped portion 3111 is located in the center of the first channel layer 3110, the two lightly-doped portions 3113 are locate on opposite sides of the non-N doped portion 3111. Each heavily-doped portion 3112 is located at a side of one lightly-doped portion 3113 away from the non-N doped portion 3111. Both the lightly-doped portion 3113 and the heavily-doped portion 3112 are made of polycrystalline silicon doped with N-type ion. The heavily-doped portion 3112 has a N-type ion concentration that is greater than that of the lightly-doped portion 3113, and the lightly-doped portion 3113 has a N-type ion concentration that is greater than that of the non-N doped portion 3111.

The fourth TFT 3400 is substantially the same as the first TFT 3100, except that the fourth TFT 3400 includes a fourth channel layer 3410 which has P-type ions and is different from the first channel layer 3110 of the first TFT 3100. The fourth channel layer 3410 includes an ultra-lightly-doped portion 3411, two lightly-doped portions 3413, and two heavily-doped portions 3412. The ultra-lightly-doped portion 3411 is located in the center of the fourth channel layer 3410 and the two lightly-doped portions 3413 are located at opposite sides of the ultra-lightly-doped portion 3411. Each heavily-doped portion 3412 is located at a side of one lightly-doped portion 3413 away from the ultra lightly-doped portion 3411. Both the lightly-doped portion 3413 and the heavily-doped portion 3412 are made of polycrystalline silicon doped with P-type ions. The heavily-doped portion 3412 has a P-type ion concentration that is greater than that of the lightly-doped portion 3413, and the lightly-doped portion 3413 has a P-type ion concentration that is greater than that of the ultra lightly-doped portion 3411.

FIG. 4 shows that the fourth TFT 3400 is positioned in the peripheral area 982, but the fourth TFT 3400 is not limited to being positioned in the peripheral area 982. In other exemplary embodiments, the fourth TFT 3400 can also be positioned in the display area 981.

Figure 5:
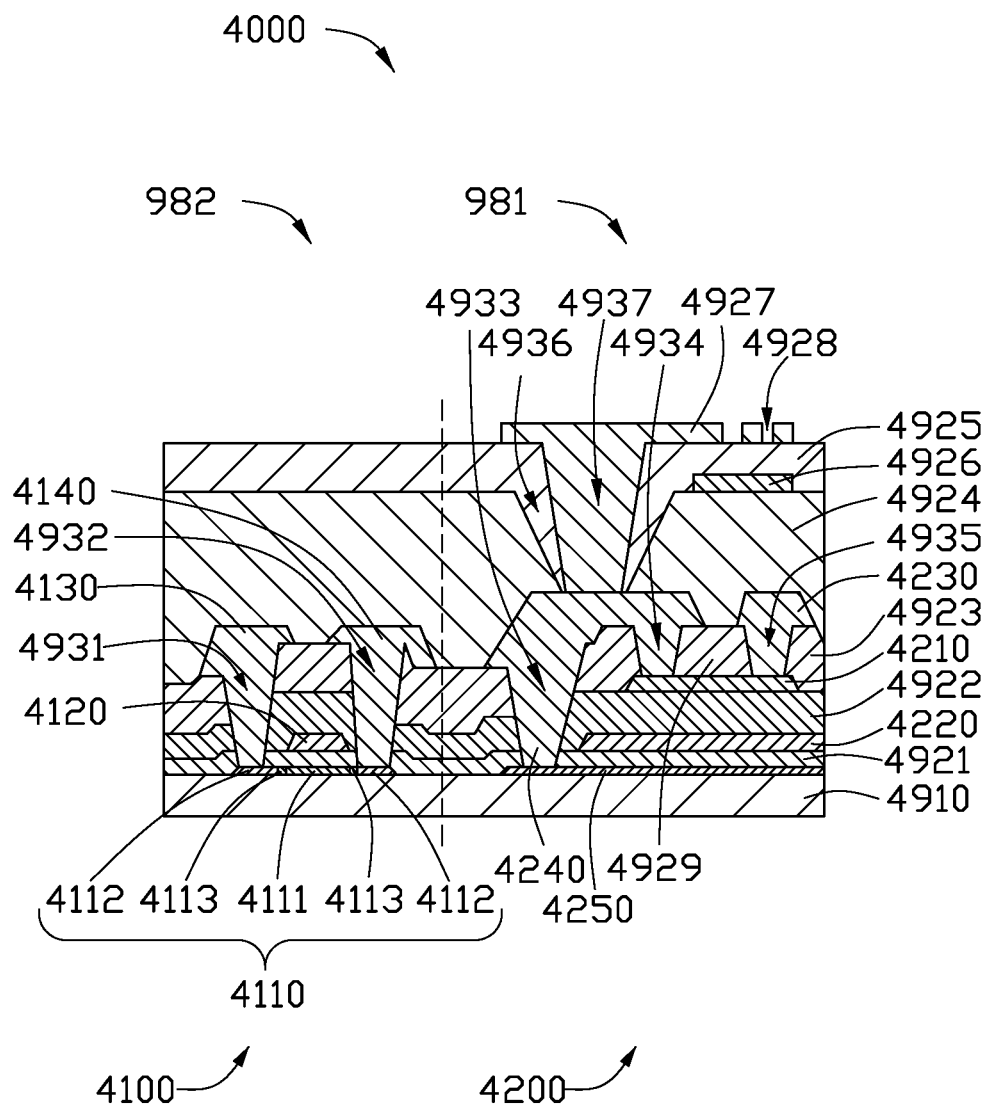
FIG. 5 is a cross-sectional view of a fourth exemplary embodiment of an array substrate.

FIG. 5 illustrates the fourth exemplary embodiment of the array substrate 4000 in part and in cross section. The array substrate 4000 may be used in an LCD device. The array substrate 4000 includes at least two types of TFTs, these being the first TFT 4100 and the second TFT 1200. The array substrate 4000 includes a plurality of first TFTs 4100 and a plurality of second TFTs 4200. FIG. 5 only shows one first TFT 4100 and one second TFT 4200. In this exemplary embodiment, the first TFTs 4100 are positioned in the peripheral area 982 and are applied in the scan driving circuit 1996 and the data driving circuit 1997. The second TFTs 4200 are positioned in the display area 981 and are configured to drive liquid crystal to rotate and form a display.

The array substrate 4000 further includes a substrate 4910, a first insulator layer 4921, a second insulator layer 4922, a third insulator layer 4923, a fourth insulator layer 4924, a fifth insulator layer 4925, a first electrode layer 4926, and a second electrode layer 4927.

The first TFT 4100 includes a first channel layer 4110, a first gate electrode 4120, a first source electrode 4130, and a first drain electrode 4140. The second TFT 4200 includes a second channel layer 4210, a second gate electrode 4220, a second electrode source 4230, and a second drain electrode 4240. A storage capacitance layer 4250 is formed under the second TFT 4200.

The first channel layer 4110 and the storage capacitance layer 4250 are directly formed on the substrate 4910. Both the first channel layer 4110 and the storage capacitance layer 4250 are made of a semiconducting material containing polycrystalline silicon. The first channel layer 4110 may be doped with P-type ions or N-type ions. The P-type ion can be boron ion, the N-type ion can be phosphate ion. In this exemplary embodiment, the first channel layer 4110 is doped with P-type ions and includes a non-doped portion 4111, two lightly-doped portions 4113, and two heavily-doped portions 4112. The non-doped portion 4111 is located in the center of the first channel layer 4110, the two lightly-doped portions 4113 are located at opposite sides of the non-doped portion 4111. Each heavily-doped portion 4112 is located at a side of one lightly-doped portion 4113 away from the non-doped portion 4111.

Both the lightly-doped portion 4113 and the heavily-doped portion 4112 are made of polycrystalline silicon doped with P-type ions. The heavily-doped portion 4112 has a P-type ion concentration that is greater than that of the lightly-doped portion 4113, and the lightly-doped portion 4113 has a P-type ion concentration that is greater than that of the non-doped portion 4111.

The storage capacitance layer 4250 is made of same materials as the heavily-doped portion 4112. That is, the storage capacitance layer 4250 is made of polycrystalline silicon doped with P-type ions. The storage capacitance layer 4250 is configured to be an electrode for the storage capacitor.

The first insulator layer 4921 is formed on the substrate 4910 and covers the first channel layer 4110 and the storage capacitance layer 4250. The first gate electrode 4120 and the second gate electrode 4220 are formed on the first insulator layer 4921. The first gate electrode 4120 corresponds to the first channel layer 4110, and particularly corresponds to the non-doped portion 4111. The second gate electrode 4220 corresponds to the storage capacitance layer 4250.

The second insulator layer 4922 is formed on the first insulator layer 4921 and covers the first gate electrode 4120 and the second gate electrode 4220.

The second channel layer 4210 is formed on the second insulator layer 4922 and corresponds to the second gate electrode 4220. The second channel layer 4210 is made of a semiconducting material containing metal oxide. In this exemplary embodiment, the second channel layer 4210 is made of IGZO.

The third insulator layer 4923 is formed on the second insulator layer 4922 and covers the second channel layer 4210. A first source hole 4931 corresponding to one heavily-doped portion 4112 is defined in the third insulator layer 4923 and passes through the third insulator layer 4923, the second insulator layer 4922, and the first insulator layer 4921. A first drain hole 4932 corresponding to one heavily-doped portion 4112 is defined in the third insulator layer 4923 and passes through the third insulator layer 4923, the second insulator layer 4922, and the first insulator layer 4921. A storage capacitance hole 4933 corresponding to the storage capacitance layer 4250 is defined in the third insulator layer 4923 and passes through the third insulator layer 4923, the second insulator layer 4922, and the first insulator layer 4921. A second drain hole 4934 corresponding to the second channel layer 4210 is defined in the third insulator layer 4923 and passes through the third insulator layer 4923.

A second source hole 4935 corresponding to the second channel layer 4210 is defined in the third insulator layer 4923 and passes through the third insulator layer 4923. The second drain hole 4934 is positioned adjacent to a left side of the second channel layer 4210, and the second source hole 4935 is positioned adjacent to a right side of the second channel layer 4210.

A portion of the third insulator layer 4923 positioned between the second drain hole 4934 and the second source hole 4935 is defined as protection portion 4929. The protection portion 4929 covers at least a portion of the second channel layer 4210 and protects the second channel layer 4210 from damage during an etching process for forming the second source electrode 4230 and the second drain electrode 4240.

The first source electrode 4130 is formed on the third insulator layer 4923 and extends into the first source hole 4931 to electrically couple to one of the heavily-doped portions 4112. The first drain electrode 4140 is formed on the third insulator layer 4923 and extends into the first drain hole 4932 to electrically couple to another heavily-doped portion 4112. The second source electrode 4230 is formed on the third insulator layer 4923 and extends into the second source hole 4935 to electrically couple to the second channel layer 4210. The second drain electrode 4240 is formed on the third insulator layer 4923 and extends into the second drain hole 4934 to electrically couple to the second channel layer 4210. The second drain electrode 4240 also extends into the storage capacitance hole 4933 to electrically couple to the storage capacitance layer 4250. The storage capacitance layer 4250 and the second gate electrode 4220 thereby cooperatively form a storage capacitor.

The fourth insulator layer 4924 is formed on the third insulator layer 4923 and covers the first source electrode 4130, the first drain electrode 4140, the second source electrode 4230, and the second drain electrode 4240. A first connecting hole 4936 corresponding to the second drain electrode 4240 is defined in the fourth insulator layer 4924 and passes through the fourth insulator layer 4924. The first electrode layer 4926 is formed on the fourth insulator layer 1924.

The fifth insulator layer 4925 is formed on the fourth insulator layer 4924 and covers the first electrode layer 4926. The fifth insulator layer 4925 also extends into the first connecting hole 4936. A second connecting hole 4937 corresponding to the first connecting hole 4936 is defined in the fifth insulator layer 4925 and passes through the fifth insulator layer 4925 and the fourth insulator layer 4924. The second electrode layer 4927 is formed on the fifth insulator layer 4925 and extends into the second connecting hole 4937 to electrically couple to the second drain electrode 4240.

In this exemplary embodiment, the second electrode layer 4927 defines a plurality of gaps 4928 corresponding to the first electrode layer 4926. In other exemplary embodiments, the first electrode layer 4926 may define a plurality of gaps corresponding to the second electrode layer 4927.

In some exemplary embodiments, the array substrate 4000 may further include a buffer layer (not shown) formed on the substrate 4910. The first channel layer 4110, the storage capacitance layer 4250, and the first insulator layer 4921 are then formed on the buffer layer.

The substrate 4910 typically comprises an insulating material. Suitable materials for the substrate 4910 may include any glass, quartz, or plastic which has sufficient optical transparency (e.g., for electromagnetic radiations in the visible spectrum for visual display applications). In some exemplary embodiments, the substrate 4910 may comprise ceramic and/or silicon materials. In some applications, flexible substrate materials may be adopted. Suitable choice of material for the flexible substrate may include, for example, PES, PEN, PE, PI, PVC, PET, and stainless steel, or combinations thereof.

The first gate electrode 4120, the first source electrode 4130, the first drain electrode 4140, the second gate electrode 4220, the second source electrode 4230, and the second drain electrode 4240 may comprise Al, Ag, Au, Co, Cr, Cu, In, Mn, Mo, Ni, Nd, Pd, Pt, Ti, W, Zn, or other suitable conductive materials, or suitable mixture/alloy thereof. For achieving greater optical efficiency, in some exemplary embodiments, the first gate electrode 4120, the first source electrode 4130, the first drain electrode 4140, the second gate electrode 4220, the second source electrode 4230, and the second drain electrode 4240 may include a transparent conductive material, such as ITO, IZO, AZO, or a suitable combination thereof.

The first insulator layer 4921, the second insulator layer 4922, the third insulator layer 4923, the fourth insulator layer 4924, and the fifth insulator layer 4925 may comprise a suitable dielectric material, such as $SiO_x$, $SiN_x$, $SiO_xN_y$, $AlO_x$, $Y_2O_3$, $HfO_x$, $ZrO_x$, AlN, AlNO, $TiO_x$, $BaTiO_3$, or $PbTiO_3$. In some exemplary embodiments, one or more high-K dielectric material may be used as the first insulator layer 4921, the second insulator layer 4922, the third insulator layer 4923, the fourth insulator layer 4924, and the fifth insulator layer 4925. High-K dielectric materials may include, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The first electrode layer 4926 and the second electrode layer 4927 can be made of a transparent conductive material, such as ITO, IZO, AZO, or a suitable combination thereof.

The protection portion 4929 protects the second channel layer 4210 from damage during a forming process of the second source electrode 4230 and the second drain electrode 4240.

In this exemplary embodiment, the first TFTs 4100 are positioned in the peripheral area 982, and the second TFTs 4200 are positioned in the display area 981. In other exemplary embodiment, the first TFTs 4100 are not limited to being positioned in the peripheral area 982 and can be positioned in the display area 981. The second TFTs 4200 are not limited to being positioned in the display area 981 and can be positioned in the peripheral area 982.

Figure 6:
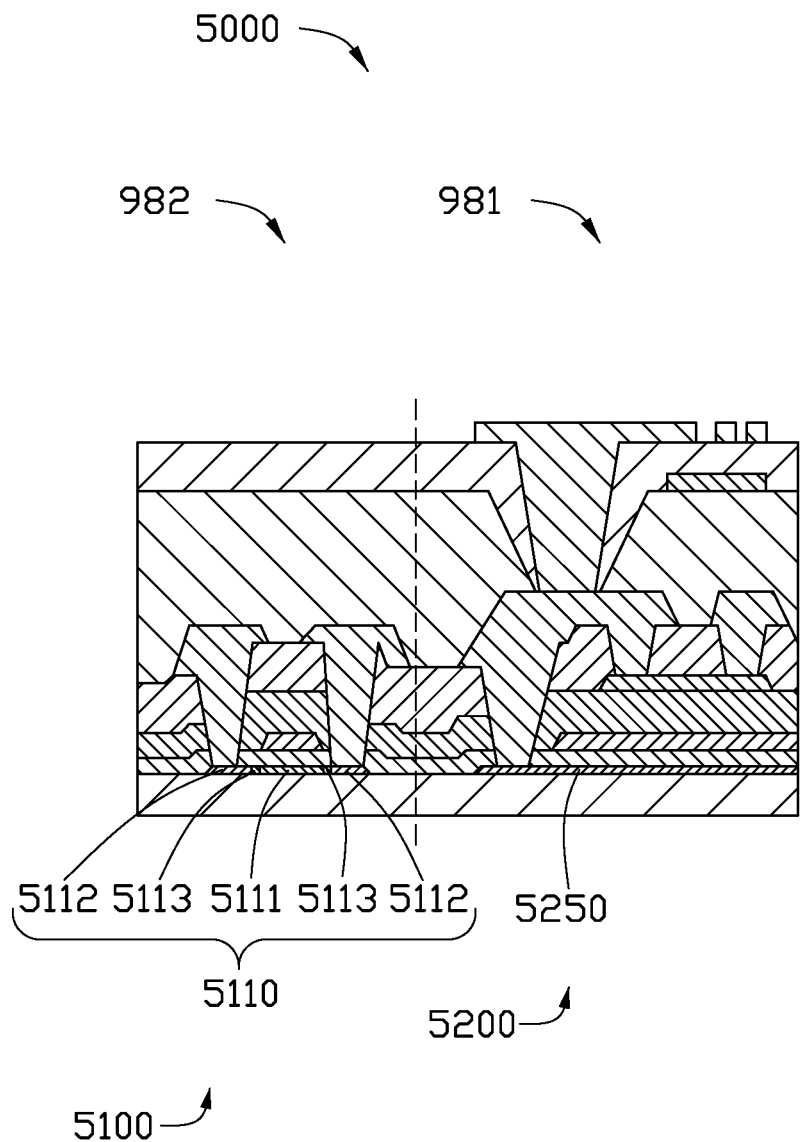
FIG. 6 is a cross-sectional view of a fifth exemplary embodiment of an array substrate.

FIG. 6 illustrates the fifth exemplary embodiment of the array substrate 5000 in part and in cross section. The array substrate 5000 is used in an LCD device. The array substrate 5000 is substantially the same as the array substrate 4000, except that the first TFT 5100 of the array substrate 5000 includes a first channel layer 5110 that is different from the first channel layer 4110. The second TFT 5200 of the array substrate 5000 includes a storage capacitance layer 5250 that is different from the storage capacitance layer 4250.

The first channel layer 4110 is made of polycrystalline silicon doped with P-type ions, while the first channel layer 5110 is made of polycrystalline silicon doped with N-type ions. The storage capacitance layer 4250 is also made of polycrystalline silicon doped with P-type ions, while the storage capacitance layer 5250 is made of polycrystalline silicon doped with N-type ions.

The first channel layer 5110 (with N-type ions) includes an ultra lightly-doped portion 5111, two lightly-doped portions 5113, and two heavily-doped portions 5112. The ultra-lightly-doped portion 5111 is located in the center of the first channel layer 5110, the two lightly-doped portions 5113 are located at opposite sides of the ultra-lightly-doped portion 5111. Each heavily-doped portion 5112 is located at a side of one lightly-doped portion 5113 away from the ultra-lightly-doped portion 5111. The heavily-doped portion 5112 has a N-type ion concentration that is greater than that of the lightly-doped portion 5113, and the lightly-doped portion 5113 has a N-type ion concentration that is greater than that of the ultra-lightly-doped portion 5111.

The storage capacitance layer 5250 is made of a same material as the heavily-doped portion 5112. That is, the storage capacitance layer 5250 is made of heavily-doped polycrystalline silicon.

Figure 7:
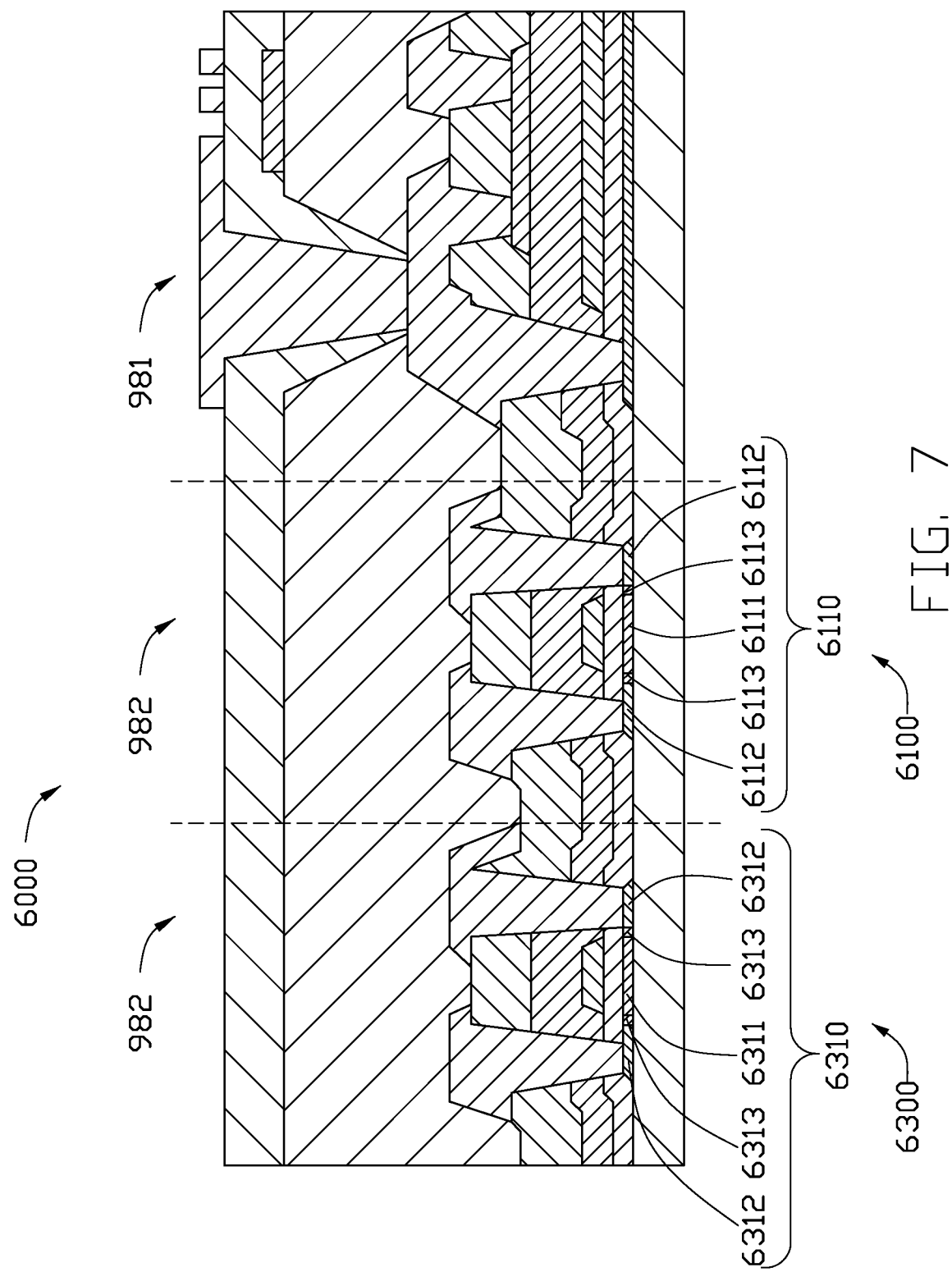
FIG. 7 is a cross-sectional view of a sixth exemplary embodiment of an array substrate.

FIG. 7 illustrates the sixth exemplary embodiment of the array substrate 6000 in part and in cross section. The array substrate 6000 is used in an LCD device. The array substrate 6000 is substantially the same as the array substrate 5000, except that the first TFT 6100 of the array substrate 6000 includes a first channel layer 6110 that is different from the first channel layer 5110, and the array substrate 6000 further includes a third TFT 6300. The fourth TFT 6300 is positioned at a side of the first TFT 6100.

In this exemplary embodiment, the first channel layer 6110 (with N-type ions) includes a non-doped portion 6111, two lightly-doped portions 6113, and two heavily-doped portions 6112. The non-N doped portion 6111 is located in the center of the first channel layer 6110, the two lightly-doped portions 6113 are located at opposite sides of the non-N doped portion 6111. Each heavily-doped portion 6112 is located at a side of one lightly-doped portion 6113 away from the non-N doped portion 6111. Both the lightly-doped portion 6113 and the heavily-doped portion 6112 are made of polycrystalline silicon doped with N-type ion. The heavily-doped portion 6112 has an N-type ion concentration that is greater than that of the lightly-doped portion 6113, and the lightly-doped portion 6113 has an N-type ion concentration that is greater than that of the non-N doped portion 6111.

The third TFT 6300 is substantially the same as the first TFT 6100, except that the third TFT 6300 includes a third channel layer 6310 with P-type ions that is different from the first channel layer 6110 of the first TFT 6100. The third channel layer 6310 includes an ultra-lightly-doped portion 6311, two lightly-doped portions 6313, and two heavily-doped portions 6412. The ultra-lightly-doped portion 6311 is located in the center of the third channel layer 6310, the two lightly-doped portions 6313 are located at opposite sides of the ultra-lightly-doped portion 6311. Each heavily-doped portion 6312 is located at a side of one lightly-doped portion 6313 away from the ultra lightly-doped portion 6311. Both the lightly-doped portion 6313 and the heavily-doped portion 6312 are made of polycrystalline silicon doped with P-type ion. The heavily-doped portion 6312 has a P-type ion concentration that is greater than that of the lightly-doped portion 6313, and the lightly-doped portion 6313 has a P-type ion concentration that is greater than that of the ultra-lightly-doped portion 6311.

FIG. 7 shows that the third TFT 6300 is positioned in the peripheral area 982, but the third TFT 6300 is not limited to being positioned in the peripheral area 982. In other exemplary embodiments, the third TFT 6300 can also be positioned in display area 981.

Figure 8:
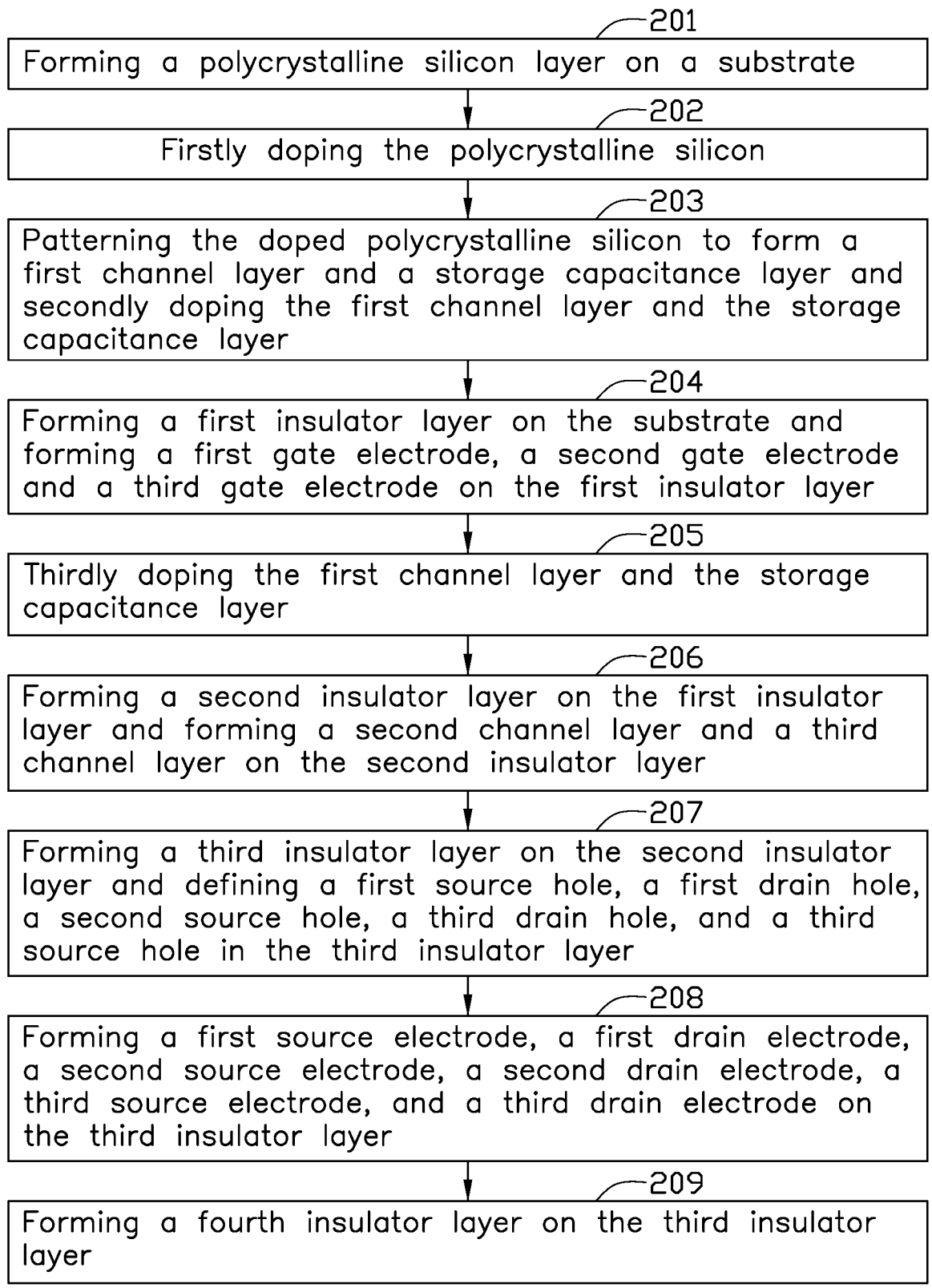
FIG. 8 is a flow chart of a method for making the array substrate of FIG. 1.

FIG. 8 illustrates an example method for making the array substrate 1000 shown in FIG. 2. The example method is provided by way of example, as there are a variety of ways to carry out the method. Each block shown in FIG. 8 represents one or more processes, methods, or subroutines, carried out in the exemplary method. The exemplary method can begin at block 201.

Figure 9A:
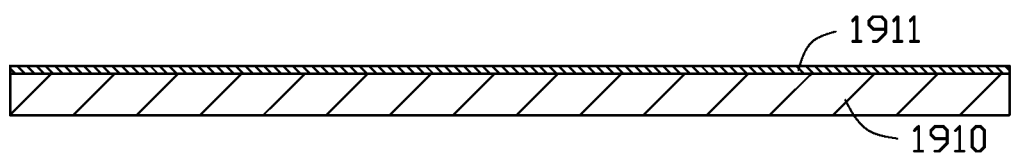
FIG. 9A through 9I illustrate steps for manufacturing the array substrate of FIG. 2 according to blocks in FIG. 8.

At block 201, a polycrystalline silicon layer 1911 is formed on a substrate 1910 as shown in FIG. 9A. The process of forming the polycrystalline silicon layer 1911 on the substrate 1910 may comprise depositing an amorphous silicon layer, and laser annealing to convert the amorphous silicon layer to be a polycrystalline silicon layer 1911. The substrate 1910 can be made of a common material such as glass, quartz, or other material that is flexible.

Figure 9B:
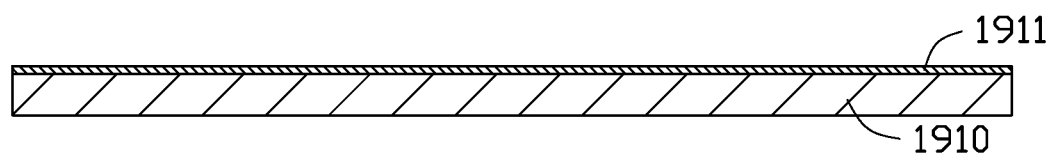

At block 202, as shown in FIG. 9B, the polycrystalline silicon layer 1911 is doped with N-type ions for the first time. The N-type ion has a valence charge of positive five, such as phosphate ion. The whole polycrystalline silicon layer 1911 is doped with N-type ions having a low concentration during the first doping process.

Figure 9C:
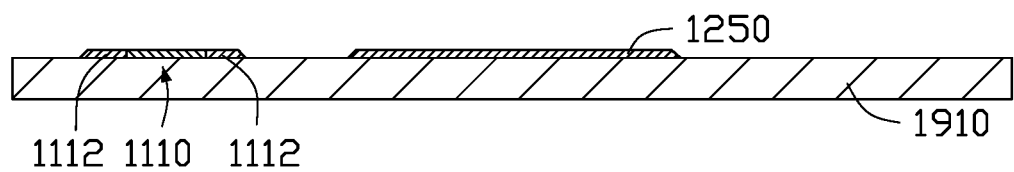

At block 203, as shown in FIG. 9C, the polycrystalline silicon layer 1911 is patterned and doped with P-type ions for the second time to form the first channel layer 1110 and the storage capacitance layer 1250. Only two side portions of the first channel layer 1110 and the storage capacitance layer 1250 are doped with P-type ions have a high concentration during the second doping process. The P-type ion has a valence charge of positive three, such as boron ion. Two side portions of the first channel layer 1110 doped with P-type ions have a high concentration finally form two heavily-doped portions 1112.

Figure 9D:
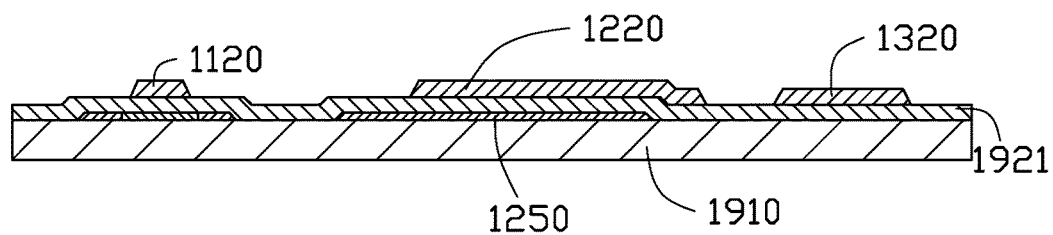

At block 204, as shown in FIG. 9D, a first insulator layer 1921 is formed on the substrate 1910, and then a first gate electrode 1120, a second gate electrode 1220, and a third gate electrode 1320 are formed on the first insulator layer 1921. The first insulator layer 1921 covers the first channel layer 1110 and the storage capacitance layer 1250. The first gate electrode 1120 corresponds to the first channel layer 1110 and outside the heavily-doped portions 1112. The second gate electrode 1220 corresponds to the storage capacitance layer 1250. The process of forming the first gate electrode 1120, the second gate electrode 1220, and the third gate electrode 1320 may comprise depositing a first metal layer on the first insulator layer 1921, and etching and patterning the first metal layer to form the first gate electrode 1120, the second gate electrode 1220, and the third gate electrode 1320. The first metal layer can be made of an electrically conductive metal or alloy, such as Mo, Al, Cr, Cu, Nd, and Mo—Al alloy. The etching process can be a photolithography etching process.

Figure 9E:
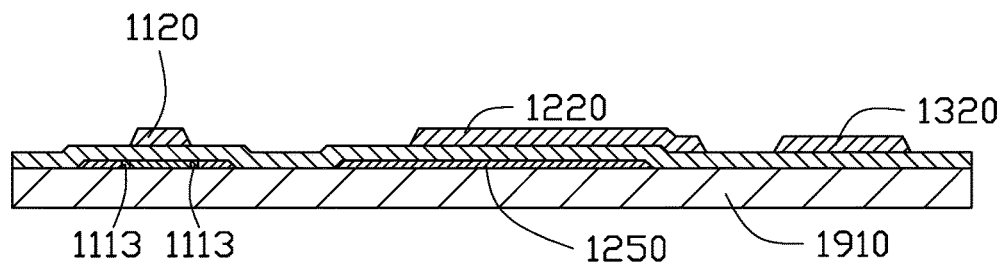

At block 205, as shown in FIG. 9E, the first channel layer 1110 is doped with P-type ions for the third time. Only two portions of the first channel layer 1110, which extend beyond the first gate electrode 1120 and are not the heavily-doped portions 1112, are doped with P-type ions and have a low concentration during the third doping process. The P-type ion has a valence charge of positive three, such as boron ion. Two portions of the first channel layer 1110 doped with P-type ions have a low concentration finally form two lightly-doped portions 1113.

Figure 9F:
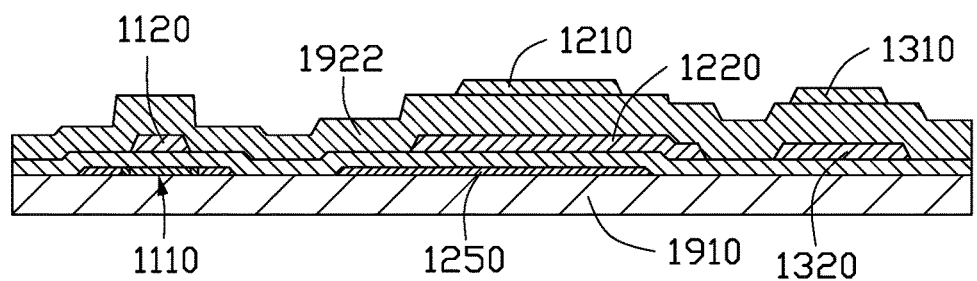

At block 206, as shown in FIG. 9F, a second insulator layer 1922 is formed on the first insulator layer 1921, and then a second channel layer 1210 and a third channel layer 1310 are formed on the second insulator layer 1922. The second insulator layer 1922 covers the first gate electrode 1120, the second gate electrode 1220, and the third gate electrode 1320. The second channel layer 1210 corresponds to the second gate electrode 1220. The third channel layer 1310 corresponds to the third gate electrode 1320. Both the second channel layer 1210 and the third channel layer 1310 are made of a semiconducting material containing metal oxide. In this exemplary embodiment, both the second channel layer 1210 and the third channel layer 1310 are made of IGZO. The process of forming the second channel layer 1210 and the third channel layer 1310 may comprise depositing a semiconductor layer (not shown) on the second insulator layer 1922, and etching and patterning the semiconductor layer to form the second channel layer 1210 and the third channel layer 1310.

Figure 9G:
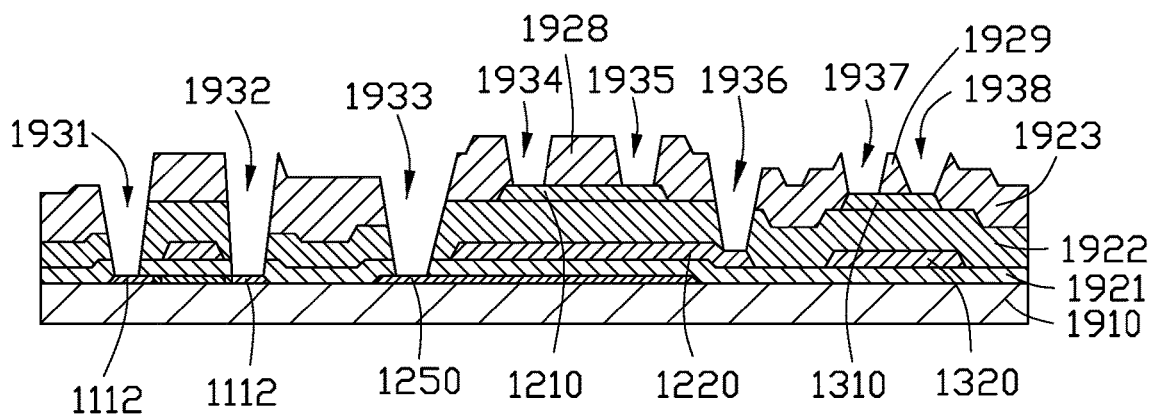

At block 207, as shown in FIG. 9G, a third insulator layer 1923 is formed on the second insulator layer 1922, and then a first source hole 1931, a first drain hole 1932, a storage capacitance hole 1933, a second drain hole 1934, a second source hole 1935, a second gate hole 1936, a third drain hole 1937, and a third source hole 1938 are defined in the third insulator layer 1923.

The first source hole 1931 corresponds to one of the heavily-doped portions 1112 and passes through the third insulator layer 1923, the second insulator layer 1922, and the first insulator layer 1921. The first drain hole 1932 corresponds to another heavily-doped portions 1112 and passes through the third insulator layer 1923, the second insulator layer 1922, and the first insulator layer 1921. The storage capacitance hole 1933 corresponds to the storage capacitance layer 1250 and passes through the third insulator layer 1923, the second insulator layer 1922, and the first insulator layer 1921. The second drain hole 1934 corresponds to a left side of the second channel layer 1210 and passes through the third insulator layer 1923. The second source hole 1935 corresponds to a right side of the second channel layer 1210 and passes through the third insulator layer 1923. The second gate hole 1936 corresponds to a right side of the second gate electrode 1220 and passes through the third insulator layer 1923 and the second insulator layer 1922. The third drain hole 1937 corresponds to a left side of the third channel layer 1310 and passes through the third insulator layer 1923. The third source hole 1938 corresponds to a right side of the third channel layer 1310 and passes through the third insulator layer 1923.

A portion of the third insulator layer 1923 between the second drain hole 1934 and the second source hole 1935 defines a protection portion 1928. The protection portion 1928 covers the second channel layer 1210 and protects the second channel layer 1210 from damage during an etching process for the following forming the second source electrode 1230 and the second drain electrode 1240. A portion of the third insulator layer 1923 positioned between the third drain hole 1937 the third source hole 1938 defines a protection portion 1929. The protection portion 1929 covers at least a portion of the third channel layer 1310 and can protect the third channel layer 1310 from damage during a etch process for the following forming the third source electrode 1330 and the third drain electrode 1340.

Figure 9H:
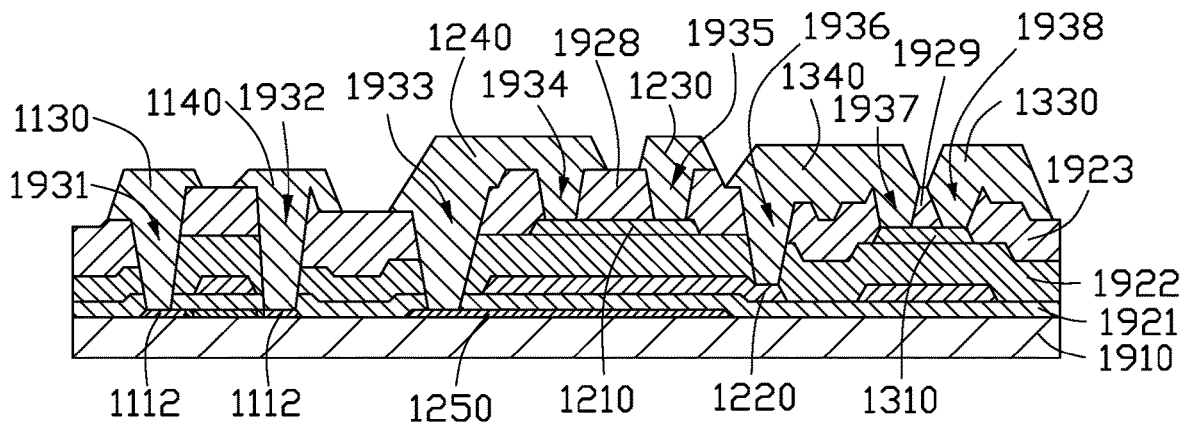

At block 208, as shown in FIG. 9H, a first source electrode 1130, a first drain electrode 1140, a second source electrode 1230, a second drain electrode 1240, a third source electrode 1330, and a third drain electrode 1340 are formed on the third insulator layer 1923. The first source electrode 1130 extends into the first source hole 1931 to electrically couple to the heavily-doped portion 1112. The first drain electrode 1140 extends into the first drain hole 1932 to electrically couple to the heavily-doped portion 1112. The second drain electrode 1240 extends into the storage capacitance hole 1933 to electrically couple to the storage capacitance layer 1250, the second drain electrode 1240 also extends into the second drain hole 1934 to electrically couple to the second channel layer 1210. The second source electrode 1230 extends into the second source hole 1935 to electrically couple to the second channel layer 1210. The third source electrode 1330 extends into the third source hole 1938 to electrically couple to the third channel layer 1310. The third drain electrode 1340 extends into the second gate hole 1936 to electrically couple to the second gate electrode 1220, the third drain electrode 1340 also extends into the third drain hole 1937 to electrically couple to the third channel layer 1310.

The process of forming the first source electrode 1130, the first drain electrode 1140, the second source electrode 1230, the second drain electrode 1240, the third source electrode 1330, and the third drain electrode 1340 may comprise depositing a second metal layer (not shown) on the third insulator layer 1923, and etching and patterning the second metal layer to form the first source electrode 1130, the first drain electrode 1140, the second source electrode 1230, the second drain electrode 1240, the third source electrode 1330, and the third drain electrode 1340. The second metal layer can be made of an electrically conductive metal or alloy, such as Mo, Al, Cr, Cu, Nd, and Mo—Al alloy. The etching process can be a photolithography etching process.

Figure 9I:
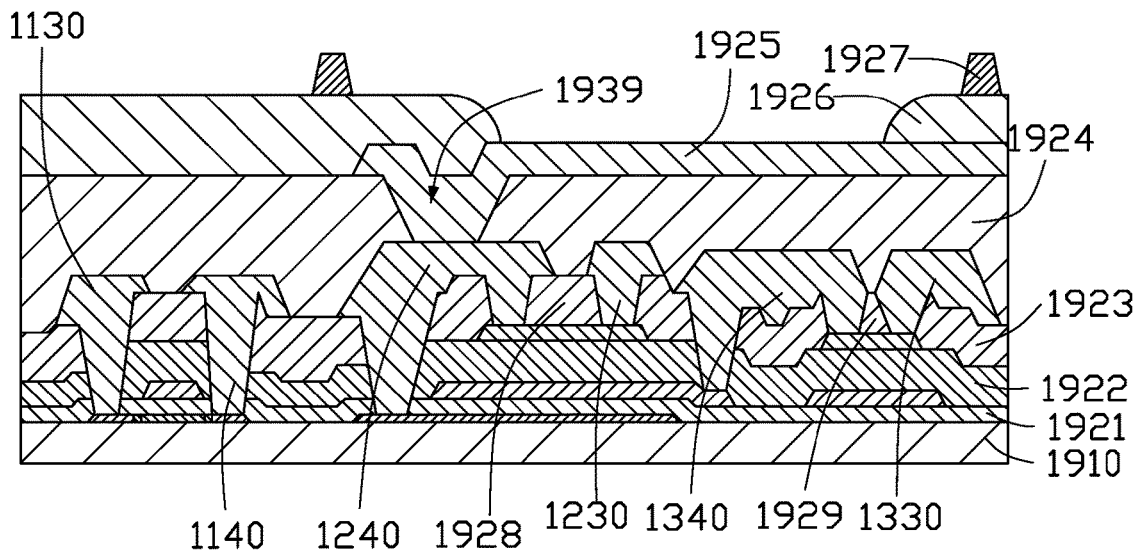

At block 209, as shown in FIG. 9I, a fourth insulator layer 1924 is formed on the third insulator layer 1923; an anode hole 1939 corresponding to the second drain electrode 1240 is defined in the fourth insulator layer 1924; an anode layer 1925 is formed on the fourth insulator layer 1924; a pixel electrode layer 1926 is formed on the fourth insulator layer 1924; and finally a spacer layer 1927 is formed on the pixel electrode layer 1926. The fourth insulator layer 1924 completely covers the first source electrode 1130, the first drain electrode 1140, the second source electrode 1230, the second drain electrode 1240, the third source electrode 1330, and the third drain electrode 1340. The anode hole 1939 passes through the fourth insulator layer 1924. The anode layer 1925 extends into the anode hole 1939 to electrically couple to the second drain electrode 1240.

In this exemplary embodiment, the first channel layer 1110 is formed by three doping processes, which are first doping N-type ions having a low concentration, second doping P-type ions having a high concentration, and third doping P-type ions having a low concentration. In other exemplary embodiments, the first channel layer 1110 can be formed other different doping process.

A method for making the array substrate 2000 is substantially the same as the method for making the array substrate 1000, except that three doping process of the first channel layer 21110 are first doping N-type ions having a low concentration, second doping N-type ions having a high concentration, and third doping N-type ions having a low concentration.

A method for making the array substrate 3000 is substantially the same as the method for making the array substrate 2000, except that the first channel layer 3110 is formed by three doping processes, which are first doping P-type ions having a low concentration, second doping N-type ions having a high concentration, and third doping N-type ions having a low concentration. The method for making the array substrate 3000 further comprises forming a fourth TFT 3400 substantially the same as the forming of the first TFT 3100, except that the fourth channel layer 3410 of the fourth TFT 3400 is formed by three doping processes, which are first doping P-type ions having a low concentration, second doping P-type ions having a high concentration, and third doping P-type ions having a low concentration.

Figure 10:
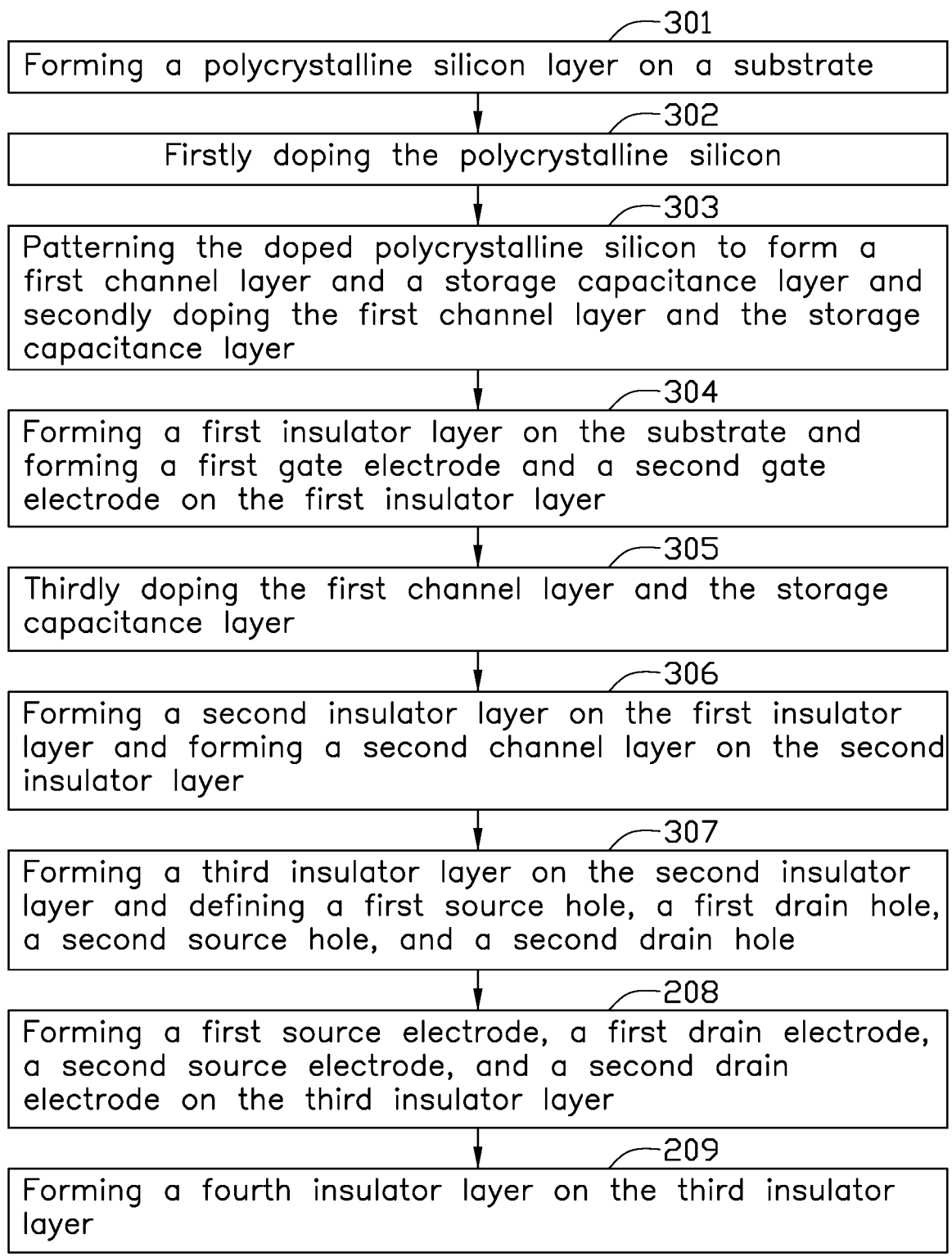
FIG. 10 is a flow chart of a method for making the array substrate of FIG. 5.

FIG. 10 illustrates an example method for making the array substrate 4000 shown in FIG. 5. The example method is provided by way of example, as there are a variety of ways to carry out the method. Each block shown in FIG. 10 represents one or more processes, methods, or subroutines, carried out in the exemplary method. The exemplary method can begin at block 301.

Figure 11A:
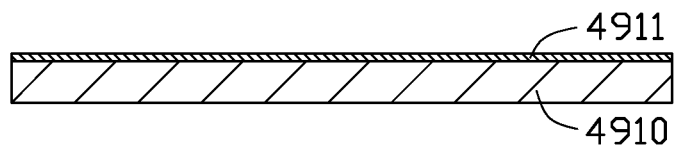
FIG. 11A through 11I illustrate steps for manufacturing the array substrate of FIG. 5 according to blocks in FIG. 10.

At block 301, a polycrystalline silicon layer 4911 is formed on a substrate 4910 as shown in FIG. 11A. The process of forming the polycrystalline silicon layer 4911 on the substrate 4910 may comprise depositing an amorphous silicon layer, and laser annealing to convert the amorphous silicon layer to be a polycrystalline silicon layer 4911. The substrate 4910 can be made of a common material such as glass, quartz, or other material that is flexible.

Figure 11B:
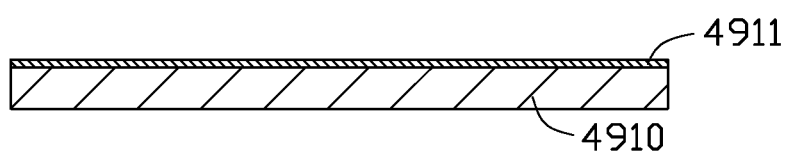

At block 302, as shown in FIG. 11B, the polycrystalline silicon layer 4911 is doped with N-type ions for the first time. The N-type ion has a valence charge of positive five, such as phosphate ion. The whole polycrystalline silicon layer 4911 is doped with N-type ions having a low concentration during the first doping process.

Figure 11C:
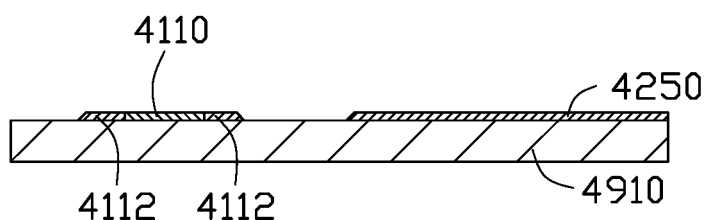

At block 303, as shown in FIG. 11C, the polycrystalline silicon layer 4911 is patterned and doped with P-type ions for the second time to form the first channel layer 4110 and the storage capacitance layer 4250. Two side portions of the first channel layer 4110 and the storage capacitance layer 4250 are doped with P-type ions have a high concentration during the second doping process. The P-type ion has a valence charge of positive three, such as boron ion. Two side portions of the first channel layer 4110 doped with P-type ions have a high concentration finally form two heavily-doped portions 4112.

Figure 11D:
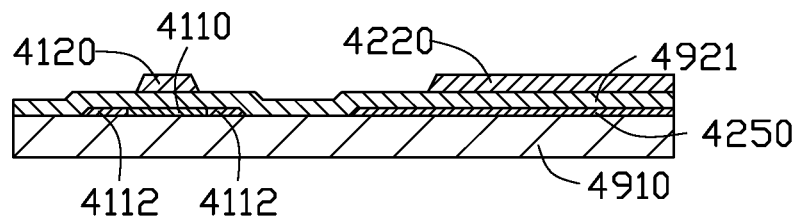

At block 304, as shown in FIG. 11D, a first insulator layer 4921 is formed on the substrate 4910, and then a first gate electrode 4120 and a second gate electrode 1220, are formed on the first insulator layer 4921. The first insulator layer 4921 covers the first channel layer 4110 and the storage capacitance layer 1250. The first gate electrode 4120 corresponds to a portion of the first channel layer 4110 that is not the heavily-doped portions 4112. The second gate electrode 4220 corresponds to the storage capacitance layer 4250. The process of forming the first gate electrode 4120 and the second gate electrode 4220 may comprise depositing a first metal layer on the first insulator layer 4921, and etching and patterning the first metal layer to form the first gate electrode 4120 and the second gate electrode 4220. The first metal layer can be made of an electrically conductive metal or alloy, such as Mo, Al, Cr, Cu, Nd, and Mo—Al alloy. The etching process can be a photolithography etching process.

Figure 11E:
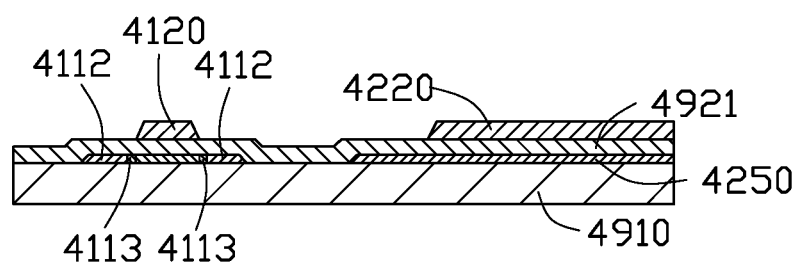

At block 305, as shown in FIG. 11E, the first channel layer 4110 is doped with P-type ions for the third time. Two portions of the first channel layer 4110 which extend beyond the first gate electrode 4120 and are not the heavily-doped portions 4112 are doped with P-type ions have a low concentration during the third doping process. The P-type ion has a valence charge of positive three, such as boron ion. Two portions of the first channel layer 4110 doped with P-type ions have a low concentration finally form two lightly-doped portions 4113.

Figure 11F:
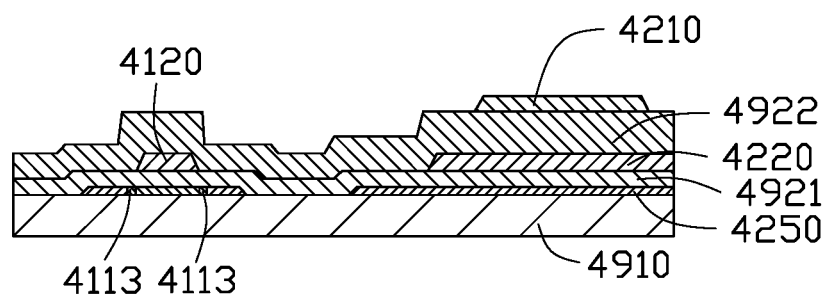

At block 306, as shown in FIG. 11F, a second insulator layer 4922 is formed on the first insulator layer 4921, and then a second channel layer 4210 is formed on the second insulator layer 4922. The second insulator layer 4922 covers the first gate electrode 4120 and the second gate electrode 4220. The second channel layer 4210 corresponds to the second gate electrode 4220. The second channel layer 4210 is made of a semiconducting material containing metal oxide. In this exemplary embodiment, the second channel layer 4210 is made of IGZO. The process of forming the second channel layer 4210 may comprise depositing a semiconductor layer (not shown) on the second insulator layer 4922, and etching and patterning the semiconductor layer to form the second channel layer 4210.

Figure 11G:
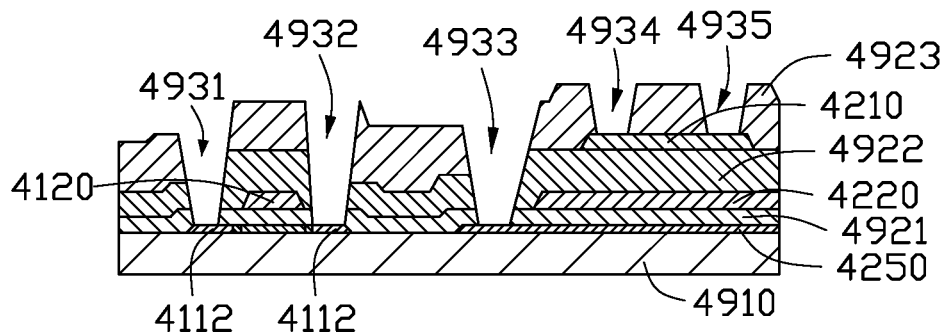

At block 307, as shown in FIG. 11G, a third insulator layer 4923 is formed on the second insulator layer 4922, and then a first source hole 4931, a first drain hole 4932, a storage capacitance hole 4933, a second drain hole 4934, and a second source hole 4935 are defined in the third insulator layer 4923.

The first source hole 4931 corresponds to one of the heavily-doped portions 4112 and passes through the third insulator layer 4923, the second insulator layer 4922, and the first insulator layer 4921. The first drain hole 4932 corresponds to another heavily-doped portions 4112 and passes through the third insulator layer 4923, the second insulator layer 4922, and the first insulator layer 4921. The storage capacitance hole 4933 corresponds to the storage capacitance layer 4250 and passes through the third insulator layer 4923, the second insulator layer 4922, and the first insulator layer 4921. The second drain hole 4934 corresponds to a left side of the second channel layer 4210 and passes through the third insulator layer 4923. The second source hole 4935 corresponds to a right side of the second channel layer 4210 and passes through the third insulator layer 4923.

A portion of the third insulator layer 4923 between the second drain hole 4934 and the second source hole 4935 defines a protection portion 4929. The protection portion 4929 covers the second channel layer 4210 and can protect the second channel layer 4210 from damage during a etch process for the following forming the second source electrode 4230 and the second drain electrode 4240.

Figure 11H:
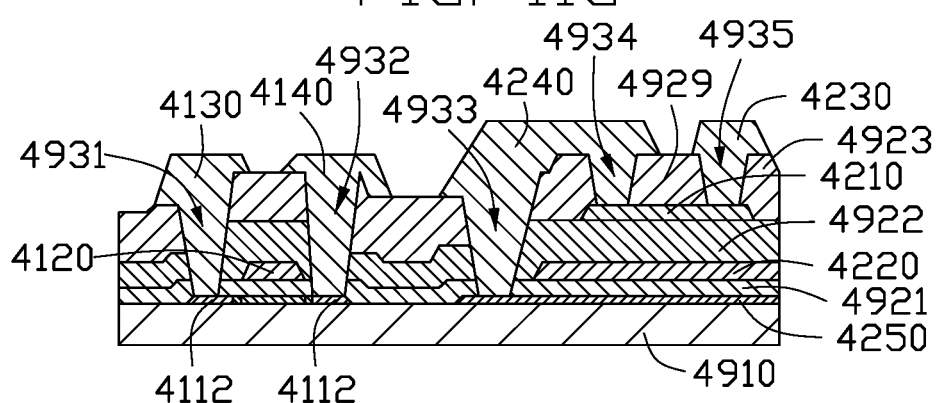

At block 308, as shown in FIG. 11H, a first source electrode 4130, a first drain electrode 4140, a second source electrode 4230, and a second drain electrode 4240 are formed on the third insulator layer 4923. The first source electrode 4130 extends into the first source hole 4931 to electrically couple to the heavily-doped portion 4112. The first drain electrode 4140 extends into the first drain hole 4932 to electrically couple to the heavily-doped portion 4112. The second drain electrode 4240 extends into the storage capacitance hole 4933 to electrically couple to the storage capacitance layer 4250; the second drain electrode 4240 also extends into the second drain hole 4934 to electrically couple to the second channel layer 4210. The second source electrode 4230 extends into the second source hole 4935 to electrically couple to the second channel layer 4210.

The process of forming the first source electrode 4130, the first drain electrode 4140, the second source electrode 4230, and the second drain electrode 4240 may comprise depositing a second metal layer (not shown) on the third insulator layer 4923, and etching and patterning the second metal layer to form the first source electrode 4130, the first drain electrode 4140, the second source electrode 4230, and the second drain electrode 4240. The second metal layer can be made of an electrically conductive metal or alloy, such as Mo, Al, Cr, Cu, Nd, and Mo—Al alloy. The etching process can be a photolithography etching process.

Figure 11I:
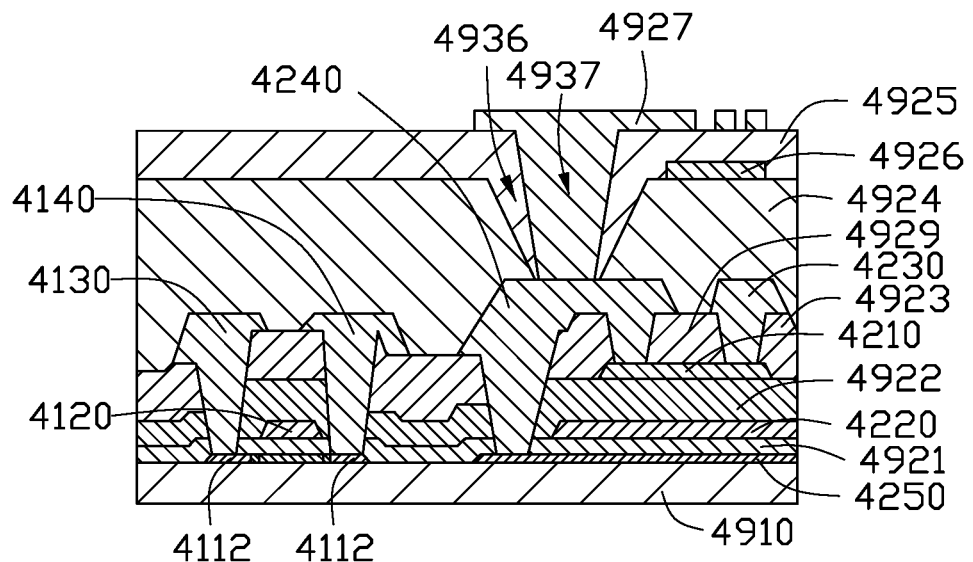

At block 309, as shown in FIG. 11I, a fourth insulator layer 4924 is formed on the third insulator layer 4923; a first connecting hole 4936 corresponding to the second drain electrode 4240 is defined in the fourth insulator layer 4924 and passes through the fourth insulator layer 4924; a first electrode layer 4926 is formed on the fourth insulator layer 4924; a fifth insulator layer 4925 is formed on the fourth insulator layer 4924; a second connecting hole 4937 corresponding to the first connecting hole 4936 is defined in the fifth insulator layer 4925 and passes through the fifth insulator layer 4925 and the fourth insulator layer 4924; and finally a second electrode layer 4927 is formed on the fifth insulator layer 4925. The fifth insulator layer 4925 covers the first electrode layer 4926 and extends into the first connecting hole 4936. The second electrode layer 4927 extends into the second connecting hole 4937 to electrically couple to the second drain electrode 4240. In this exemplary embodiment, the second electrode layer 4927 defines a plurality of gaps 4928 corresponding to the first electrode layer 4926. In other exemplary embodiments, the first electrode layer 4926 may define a plurality of gaps corresponding to the second electrode layer 4927. In this exemplary embodiment, both the first electrode layer 4926 and the second electrode layer 4927 are made of transparent conductive material, such as ITO.

In this exemplary embodiment, the first channel layer 4110 is formed by three doping processes, which are first doping N-type ions having a low concentration, second doping P-type ions having a high concentration, and third doping P-type ions having a low concentration. In other exemplary embodiments, the first channel layer 4110 can be formed other different doping process.

A method for making the array substrate 5000 is substantially the same as the method for making the array substrate 4000, except that three doping process of the first channel layer 5100 are first doping N-type ions having a low concentration, second doping N-type ions having a high concentration, and third doping N-type ions having a low concentration.

A method for making the array substrate 6000 is substantially the same as the method for making the array substrate 4000, except that the first channel layer 6110 is formed by three doping processes, which are first doping P-type ions having a low concentration, second doping N-type ions having a high concentration, and third doping N-type ions having a low concentration. The method for making the array substrate 6000 further comprises forming a third TFT 6300 substantially the same as the forming of the first TFT 6100, except that the third channel layer 6310 of the third TFT 6300 is formed by three doping processes, which are first doping P-type ions having a low concentration, second doping P-type ions having a high concentration, and third doping P-type ions having a low concentration.

The embodiments shown and described above are only examples. Many details are often found in the art such as the other features of an image device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for making an array substrate comprising:
   forming a polycrystalline silicon layer on a substrate;
   doping the polycrystalline silicon layer with N-type ion or P-type ion;
   patterning the doped polycrystalline silicon layer to form a first channel layer and a storage capacitance layer and doping the first channel layer and the storage capacitance layer;

forming a first insulator layer on the substrate, the first insulator layer covering the first channel layer and the storage capacitance layer;

forming a first gate electrode and a second gate electrode on the first insulator layer, the first gate electrode aligned with the first channel layer;

doping the first channel layer again;

forming a second insulator layer on the first insulator layer, the second insulator layer covering the first gate electrode and the second gate electrode;

forming a second channel layer on the second insulator layer, the second channel layer overlapping the second gate electrode and being made of a semiconducting material containing metal oxide;

forming a third insulator layer on the second insulator layer and defining a first source hole, a first drain hole, a second source hole, and a second drain hole; the first source hole and the first drain hole overlapping the first channel layer and extending through the third insulator layer, the second insulator layer, and the first insulator layer; the second source hole and the second drain hole overlapping the second channel layer and extending through the third insulator layer;

forming a first source electrode, a first drain electrode, a second source electrode, and a second drain electrode on the third insulator layer; wherein the first source electrode extends into the first source hole to electrically couple to the first channel layer, the first drain electrode extends into the first drain hole to electrically couple to the first channel layer, the second source electrode extends into the second source hole to electrically couple to the second channel layer, and the second drain electrode extends into the second drain hole to electrically couple to the second channel layer;

forming a fourth insulator layer on the third insulator layer to cover the first source electrode, the first drain electrode, the second source electrode, and the second drain electrode; and defining a storage capacitance hole before forming the first source electrode, the first drain electrode, the second source electrode, and the second drain electrode on the third insulator layer; wherein the storage capacitance hole overlaps the storage capacitance layer and extends through the third insulator layer, the second insulator layer, and the first insulator layer.

2. The method of claim 1, wherein the second drain electrode extends into the storage capacitance hole to electrically couple to the storage capacitance layer.

3. The method of claim 1, wherein the doping the polycrystalline silicon is carried out by doping the entire polycrystalline silicon with N-type ion having a low concentration.

4. The method of claim 3, wherein the doping the first channel layer and the storage capacitance layer is carried out by doping two side portions of the first channel layer and the entire storage capacitance layer with P-type ions or N-type ions having a high concentration, each of the two side portions is a portion of the first channel layer adjacent to a side edge of the first channel layer.

5. The method of claim 4, wherein the doping the first channel layer and the storage capacitance layer is carried out by doping two middle portions of the first channel layer with P-type ions or N-type ions having a low concentration, and each middle portion of the first channel layer extends beyond the first gate electrode and is not doped with P-type ions or N-type ions having a high concentration, each of the two middle portions is coupled to one of the two side portions.

6. The method of claim 1, wherein the method further comprises:

defining an anode hole in the fourth insulator layer, the anode hole overlapping the second drain electrode and extending through the fourth insulator layer; and forming an anode layer formed on the fourth insulator layer, the anode layer extending into the anode hole to electrically couple to the second drain electrode.

7. The method of claim 6, wherein the method further comprises forming a pixel electrode layer on the fourth insulator layer and partially covering the anode layer.

* * * * *